(12) United States Patent
Cha et al.

(10) Patent No.: US 9,786,387 B2
(45) Date of Patent: Oct. 10, 2017

(54) SEMICONDUCTOR MEMORY DEVICES, MEMORY SYSTEMS INCLUDING THE SAME AND METHOD OF CORRECTING ERRORS IN THE SAME

(71) Applicants: Sang-Uhn Cha, Yongin-si (KR); Hoi-Ju Chung, Yongin-si (KR); Jong-Pil Son, Seongnam-si (KR); Kwang-Il Park, Yongin-si (KR); Seong-Jin Jang, Seongnam-si (KR)

(72) Inventors: Sang-Uhn Cha, Yongin-si (KR); Hoi-Ju Chung, Yongin-si (KR); Jong-Pil Son, Seongnam-si (KR); Kwang-Il Park, Yongin-si (KR); Seong-Jin Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 106 days.

(21) Appl. No.: 14/729,295

(22) Filed: Jun. 3, 2015

(65) Prior Publication Data
US 2016/0062830 A1    Mar. 3, 2016

(30) Foreign Application Priority Data
Aug. 26, 2014 (KR) .......................... 10-2014-0111225

(51) Int. Cl.
*G06F 11/10* (2006.01)
*G11C 29/00* (2006.01)
*G11C 29/52* (2006.01)
(Continued)

(52) U.S. Cl.
CPC .......... *G11C 29/52* (2013.01); *G06F 11/1048* (2013.01); *G11C 29/702* (2013.01);
(Continued)

(58) Field of Classification Search
CPC ......... G11C 29/00; G11C 29/42; G11C 29/52; G11C 7/1006; G06F 11/1044; G06F 11/1048; G06F 11/1068
See application file for complete search history.

(56) References Cited

U.S. PATENT DOCUMENTS 4,201,337 A * 5/1980 Lewis .................. H03M 13/19
                                                    714/785
4,319,356 A * 3/1982 Kocol ................ G06F 11/1076
                                                    714/54
(Continued)

FOREIGN PATENT DOCUMENTS

| JP | 1994187248 A | 7/1994 |
| JP | 1998027139 A | 1/1998 |
| KR | 20080022630 A | 3/2008 |

*Primary Examiner* — Phung M Chung
(74) *Attorney, Agent, or Firm* — Harness, Dickey & Pierce, P.L.C.

(57) ABSTRACT

A semiconductor memory device includes a memory cell array in which a plurality of memory cells are arranged. The semiconductor memory device includes an error correcting code (ECC) circuit configured to generate parity data based on main data, write a codeword including the main data and the parity data in the memory cell array, read the codeword from a selected memory cell row to generate syndromes, and correct errors in the read codeword on a per symbol basis based on the syndromes. The main data includes first data of a first memory cell of the selected memory cell row and second data of a second memory cell of the selected memory cell row. The first data and the second data are assigned to one symbol of a plurality of symbols, and the first memory cell and the second memory cell are adjacent to each other in the memory cell array.

22 Claims, 28 Drawing Sheets

(51) Int. Cl.
  *G11C 11/15* (2006.01)
  *G11C 29/04* (2006.01)
  *G11C 29/44* (2006.01)
(52) U.S. Cl.
  CPC ....... *G11C 11/15* (2013.01); *G11C 2029/0411* (2013.01); *G11C 2029/4402* (2013.01)

(56) References Cited

U.S. PATENT DOCUMENTS

| | | |
|---|---|---|
| 5,490,155 A | 2/1996 | Abdoo et al. |
| 6,233,717 B1 * | 5/2001 | Choi ................... G06F 11/1072 365/185.03 |
| 6,574,746 B1 | 6/2003 | Wong et al. |
| 6,604,222 B1 | 8/2003 | Jensen |
| 6,954,871 B2 * | 10/2005 | Kuhn ................... G06F 13/161 713/401 |
| 7,237,175 B2 | 6/2007 | Hatakenaka et al. |
| 7,634,709 B2 | 12/2009 | Bauman et al. |
| 8,516,339 B1 | 8/2013 | Lesea et al. |
| 8,560,927 B1 | 10/2013 | Pagiamtzis et al. |
| 8,650,458 B2 | 2/2014 | Kim et al. |
| 2004/0153902 A1 * | 8/2004 | Machado ............ G06F 11/1068 714/710 |
| 2005/0229077 A1 * | 10/2005 | Takahashi ........... G06F 11/1008 714/758 |
| 2008/0168331 A1 * | 7/2008 | Vogelsang .......... G06F 11/1044 714/770 |
| 2010/0174967 A1 * | 7/2010 | Funaki ................ H03M 13/09 714/758 |
| 2012/0311406 A1 * | 12/2012 | Ratnam ................ G06F 11/10 714/768 |

* cited by examiner

FIG. 16B

SEMICONDUCTOR MEMORY DEVICES, MEMORY SYSTEMS INCLUDING THE SAME AND METHOD OF CORRECTING ERRORS IN THE SAME

CROSS-REFERENCE TO RELATED APPLICATION(S)

This U.S. application claims the benefit of priority under 35 USC §119 to Korean Patent Application No. 10-2014-0111225, filed on Aug. 26, 2014, in the Korean Intellectual Property Office, the contents of which are incorporated herein in their entirety by reference.

BACKGROUND

1. Technical Field

At least one example embodiment relates to memory devices, and more particularly to semiconductor memory devices, memory systems including the same and/or methods of correcting errors in the same.

2. Discussion of the Related Art

Semiconductor memory devices can be divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM). Examples of nonvolatile memory devices include phase change random access memory (PRAM), resistive random access memory (RRAM), magnetoresistive random access memory (MRAM), and ferroelectric random access memory (FRAM).

As fabrication process of the semiconductor memory devices advances and the devices become smaller in size, a bit error rate (BER) of memory cells in the semiconductor memory devices may increase.

SUMMARY

At least one example embodiment may provide a semiconductor memory device capable of enhancing error correction capability.

At least one example embodiment may provide a memory system including a semiconductor memory device capable of enhancing error correction capability.

At least one example embodiment may provide a method of correcting errors in a semiconductor memory device capable of enhancing error correction capability.

According to at least one example embodiment, a semiconductor memory device includes a memory cell array in which a plurality of memory cells are arranged. The semiconductor memory device includes an error correcting code (ECC) circuit configured to generate parity data based on main data, write a codeword including the main data and the parity data in the memory cell array, read the codeword from a selected memory cell row to generate syndromes, and correct errors in the read codeword on a per symbol basis based on the syndromes. The main data includes first data of a first memory cell of the selected memory cell row and second data of a second memory cell of the selected memory cell row. The first data and the second data are assigned to one symbol of a plurality of symbols, and the first memory cell and the second memory cell are adjacent to each other in the memory cell array.

According to at least one example embodiment, the main data includes $2^p$ bits and the parity data includes q bits (where q is greater than p and p and q are natural numbers equal to or greater than two). The ECC circuit may generate q-bit check bits based on a main data in the read codeword and may generate the syndromes with q-bit based on the q-bit check bits and q-bit parity data in the read codeword.

According to at least one example embodiment, the ECC circuit may correct the errors when the one symbol includes errors equal to or smaller than two.

According to at least one example embodiment, values of the q-bit syndromes may be linearly independent in first through third cases. The first case may correspond to a case when the first data has an error and the second data has no error, the second case mat correspond to a case when the first data has no error and the second data has an error and the third case may correspond to a case when the first data has an error and the second data has an error respectively.

According to at least one example embodiment, the ECC circuit may include an encoder to generate the parity data based on the main data and a decoder to generate the syndromes based on the read codeword to correct the errors by unit of the symbol.

According to at least one example embodiment, the encoder may include a plurality of parity generators, and each of the parity generators may generate corresponding parity bit of the q-bit parity data based on the $2^p$-bit main data.

According to at least one example embodiment, the decoder may include a check bit generator to generate the q-bit check bits based on the main data of the read codeword, a syndrome generator to generate the q-bit syndromes based on the q-bit check bits and the parity data of the read codeword and a corrector to correct the errors in the read codeword by unit of the symbol based on the q-bit syndromes.

According to at least one example embodiment, the syndrome generator may generate the syndromes, each having a logic level according to whether each corresponding bit of the q-bit check bits and the q-bit parity data is equal to each other.

According to at least one example embodiment, the syndrome generator may include a plurality of logic elements, each performing an XOR operation on corresponding bits of the q-bit check bits and the q-bit parity data to generate corresponding syndrome.

According to at least one example embodiment, the corrector may include a plurality of unit correctors and each of the unit correctors corrects errors in each symbol, which is equal to or smaller than two, by unit of the symbol, based on the syndromes.

According to at least one example embodiment, each of the unit corrector may include a symbol decoder to determine whether at least one of the first data and the second data has an error based on the syndromes and a data corrector to correct errors in one symbol, which is equal to or smaller than two, based on first through third outputs of the symbol decoder.

According to at least one example embodiment, the symbol decoder may include a first sub decoder to provide the first output signal indicating whether the first data has an error based on the syndromes, a second sub decoder to provide the second output signal indicating whether the second data has an error based on the syndromes and a third sub decoder to provide the third output signal indicating whether each of the first data and second data has an error based on the syndromes.

According to at least one example embodiment, the data corrector may include a first logic element to perform an OR operation on the first output signal and the second output signal, a second logic element to perform an OR operation on the second output signal and the third output signal, a third logic element to perform an XOR operation on the first data and an output of the first logic element to output a first corrected data and a fourth logic element to perform an XOR operation on the second data and an output of the second logic element to output a second corrected data.

According to at least one example embodiment, the data corrector may invert the first when the first data has an error, may invert the second data when the second data has an error and may invert the first data and the second data when each of the first data and the second data has an error.

According to at least one example embodiment, each of the plurality of memory cells may be a dynamic memory cell. The memory cell array may include a three-dimensional memory array in which word-lines and/or bit-lines are shared between levels.

According to at least one example embodiment, each of the plurality of memory cells may be a resistive type memory cell. The memory cell array may include a three-dimensional memory array in which word-lines and/or bit-lines are shared between levels.

According to at least one example embodiment, the resistive type memory cell may be spin transfer torque magneto-resistive random access memory (STT-MRAM) cell that includes a magnetic tunnel junction (MTJ) element and a cell transistor.

According to at least one example embodiment, the semiconductor memory device may further include a matching memory to store a row address designating the selected memory cell row and to provide a selection signal to the ECC circuit. A configuration of the symbol may be changed based on the selection signal.

According to at least one example embodiment, the ECC circuit may further include a selection circuit to change the first data and the second data in the symbol to be provided to the check bit generator in response to the selection signal.

According to at least one example embodiment, a memory system includes at least one semiconductor memory device and a memory controller. The memory controller controls the at least one semiconductor memory device and exchanges main data with the at least one semiconductor memory device. The at least one semiconductor memory device includes a memory cell array and an error correcting code (ECC) circuit. A plurality of memory cells are arranged in the memory cell array. The ECC circuit generates parity data based on the main data, writes a codeword including the main data and the parity data in the memory cell array, reads the codeword from a selected memory cell row to generate syndromes and corrects errors in the read codeword on a per symbol basis, based on the syndromes, where a first data of a first memory cell of the selected memory cell row and a second data of a second memory cell of the selected memory cell row are assigned to one symbol. The first memory cell and the second memory cell are adjacent to each other.

According to at least one example embodiment, the main data may include $2^p$ bits and the parity data may include q bits (where, q is greater than p and p and q are natural numbers equal to or greater than two). The at least one semiconductor memory device may be one of a magnetic random access memory (MRAM), a resistive random access memory (RRAM), a phase change random access memory (PRAM) and a ferroelectric random access memory (FRAM).

According to at least one example embodiment, the main data may include $2^p$ bits and the parity data may include q bits (where, q is greater than p and p and q are natural numbers equal to or greater than two). The at least one semiconductor memory device may be a dynamic random access memory (DRAM).

According to at least one example embodiment, a method of correcting errors in a semiconductor memory device includes reading a codeword including main data and parity data from a selected memory cell row of a memory cell array, generating syndromes based on the read codeword, and correcting errors in the read codeword on a per symbol basis, based on the syndromes, where a first data of a first memory cell of the selected memory cell row and a second data of a second memory cell of the selected memory cell row are assigned to one symbol. The first memory cell and the second memory cell are adjacent to each other.

According to at least one example embodiment, the main data may include $2^p$ bits, the parity data may include q bits (where, q is greater than p and p and q are natural numbers equal to or greater than two) and the syndromes may include q bits.

According to at least one example embodiment, the q-bit syndromes may be generated based on q-bit check bits and the q-bit parity data and the q-bit check bits may be generated based on the $2^p$-bits main data. Values of the q-bit syndromes may be linearly independent in first through third cases. The first case may correspond to a case when the first data has an error and the second data has no error, the second case mat correspond to a case when the first data has no error and the second data has an error and the third case may correspond to a case when the first data has an error and the second data has an error respectively.

According to at least one example embodiment, a device comprises a decoder configured to receive a codeword from a selected memory cell row of a memory cell array, the received codeword including main data and parity data. The main data includes first data of a first memory cell of the selected memory cell row and second data of a second memory cell of the selected memory cell row. The first memory cell and the second memory cell are adjacent to each other in the memory cell array, and the first data and the second data are assigned to a first symbol of a plurality of symbols. The decoder is configured to generate an error indicator for the first symbol based on the received codeword. The decoder is configured to detect errors in the received codeword based on the error indicator.

According to at least one example embodiment, the decoder is configured to generate the error indicator based on the parity data and check bit data derived from the main data.

According to at least one example embodiment, the decoder is configured to generate the error indicator for the first symbol by generating a first sub-error indicator for the first data, generating a second sub-error indicator for the second data, and combining the first sub-error indicator and the second error indicator.

According to at least one example embodiment, the decoder is configured to detect errors in the first and second data based on the first error indicator, the second error indicator, and the third error indicator.

According to at least one example embodiment, the combining includes performing an XOR operation on bits of the first error indicator and bits of the second error indicator.

Accordingly, errors in a codeword read from the selected memory cell row may be corrected on a per symbol basis, where two data of two adjacent memory cells are assigned to one symbol. Therefore, a number of parity bits or check bits required for correcting errors may be reduced by correcting one or two errors in the two adjacent memory cells having high probability of having errors.

BRIEF DESCRIPTION OF THE DRAWINGS

Illustrative, non-limiting example embodiments will be more clearly understood from the following detailed description taken in conjunction with the accompanying drawings.

Figure 16B:
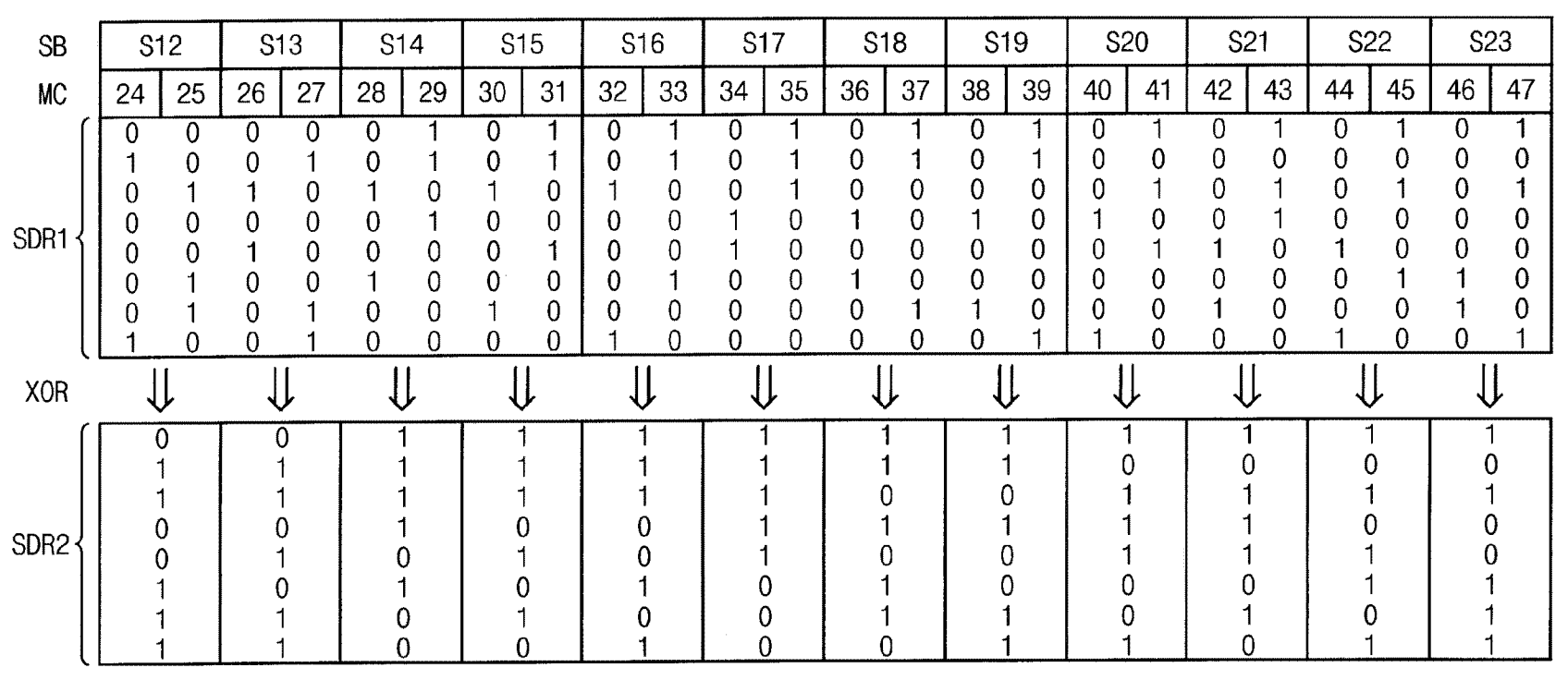

FIGS. 16A through 16F are matrixes respectively illustrating values of the syndromes according to at least one example embodiment.

DETAILED DESCRIPTION OF EXAMPLE EMBODIMENTS

Figure 1:
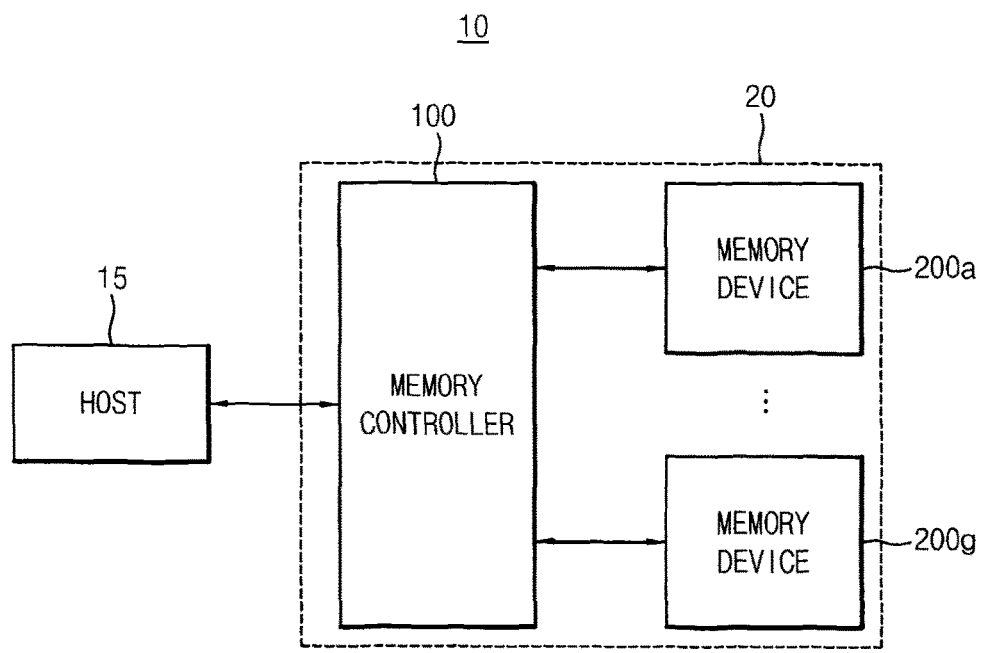
FIG. 1 is a block diagram illustrating an electronic system according to at least one example embodiment.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Expressions such as "at least one of," when preceding a list of elements, modify the entire list of elements and do not modify the individual elements of the list.

FIG. 1 is a block diagram illustrating an electronic system according to at least one example embodiment.

Referring to FIG. 1, an electronic system 10 may include a host 15 and a memory system 20. The memory system 20 may include a memory controller 100 and a plurality of semiconductor memory devices 200a~200g.

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200g. For example, the memory controller 100 may write data in the plurality of semiconductor memory devices 200a~200g or read data from the plurality of semiconductor memory devices 200a~200g in response to request from the host 15.

In addition, the memory controller 100 may issue operation commands to the plurality of semiconductor memory devices 200a~200g for controlling the plurality of semiconductor memory devices 200a~200g.

In at least one example embodiment, each of the plurality of semiconductor memory devices 200a~200g may be a memory device including resistive type memory cells such as a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 200a~200g may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2:
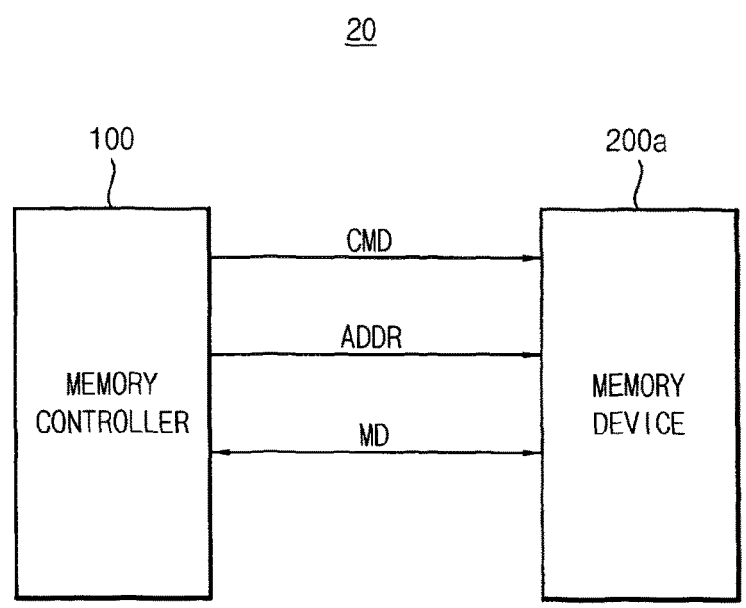
FIG. 2 is a block diagram illustrating an example of the memory system in FIG. 1 according to at least one example embodiment.

FIG. 2 is a block diagram illustrating an example of the memory system in FIG. 1 according to at least one example embodiment.

In FIG. 2, only one semiconductor memory device 200a in communication with the memory controller 100 is illustrated for convenience. However, the details discussed herein related to semiconductor memory device 200a may equally apply to the other semiconductor memory devices 200b~200g.

Referring to FIG. 2, the memory system 30 may include the memory controller 100 and the semiconductor memory device 200a. The memory controller 100 may transmit command CMD and address ADDR to the semiconductor memory device 200a. The memory controller 100 may exchange main data MD with the semiconductor memory device 200a.

Referring to FIGS. 1 and 2, the memory controller 100 may input data to the semiconductor memory device 200a or may output data from the semiconductor memory device 200a based on the request from the host 15.

Figure 3:
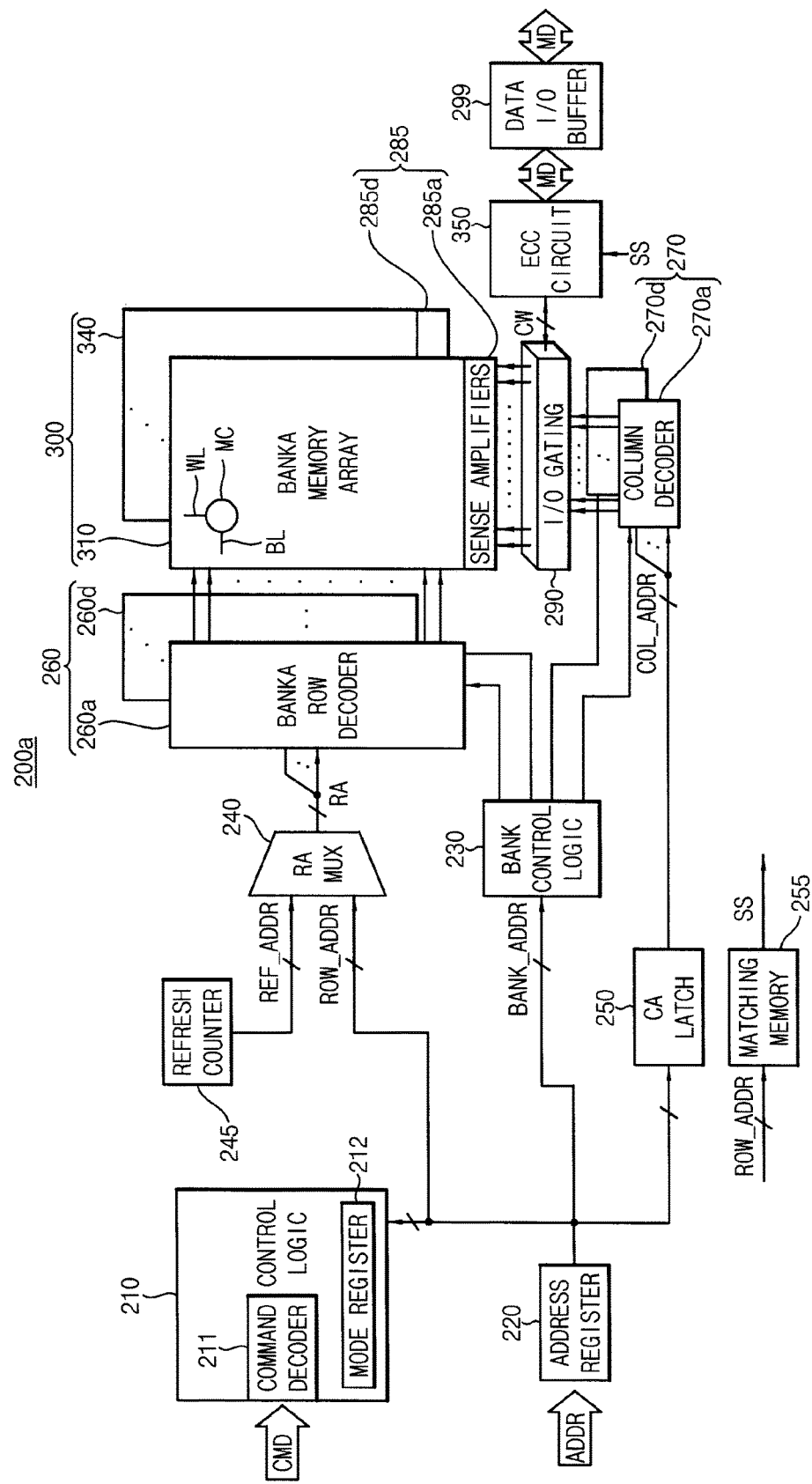
FIG. 3 is a block diagram illustrating an example of the semiconductor memory device in FIG. 2 according to at least one example embodiment.

FIG. 3 is a block diagram illustrating an example of the semiconductor memory device in FIG. 2 according to at least one example embodiment.

Referring to FIG. 3, the semiconductor memory device 200a may include a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, an error correcting code (ECC) circuit 350, a data input/output (I/O) buffer 295, a refresh counter 245 and a matching memory 255.

The memory cell array 300 may include first through fourth bank arrays 310~340. Each of the first through fourth bank arrays 310~340 may include a plurality of memory cells MC coupled to a corresponding word-line WL and a corresponding bit-line BL. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. The first through fourth bank arrays 310~340, the first through fourth bank row decoders 260a~260d, the first through fourth bank column decoders 270a~270d and first through fourth bank sense amplifiers 285a~285d may form first through fourth banks. Each of the first through fourth bank arrays 310~340 may include a plurality of semiconductor memory cells RMC, and each of semiconductor memory cells RMC is coupled to a corresponding word-line and a corresponding bit-line. Although the semiconductor memory device 200a is illustrated in FIG. 3 as including four banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In at least one example embodiment, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the input/output gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310~340, and write drivers for writing data to the first through fourth bank arrays 310~340.

Codeword CW to be read from one bank array of the first through fourth bank arrays 310~340 may be sensed by a sense amplifier coupled to the one bank array from which the data is to be read, and may be stored in the read data latches. The codeword CW stored in the read data latches may be provided to the ECC circuit 350 for correcting errors and may be provided to the memory controller 100 via the data I/O buffer 299. Main data MD to be written in one bank array of the first through fourth bank arrays 310~340 may be provided to the data I/O buffer 295 from the memory controller 100. The main data MD may be encoded to a codeword CW in the ECC circuit 350, and the write driver may write the codeword CW in one bank array of the first through fourth bank arrays 310~340.

The ECC circuit 350 may generate q-bit parity data based on $2^p$-bit main data MD, may write a codeword CW including the main data MD and the parity data in the memory cell array 300, may read the codeword CW from a selected memory cell row to generate syndromes (or error indicators) and may correct errors in the read codeword CW on a per symbol basis, based on the syndromes, where a first data of a first memory cell of the selected memory cell row and a second data of a second memory cell of the selected memory cell row are assigned to one symbol (a same symbol). The first memory cell and the second memory cell may be adjacent to each other.

The matching memory 255 may store a row address ROW_ADDR designating the selected memory cell row and may provide the ECC circuit 350 with a selection signal SS based on the row address ROW_ADDR. The ECC circuit 350 may change a configuration of the first data and the second data in one symbol in response to the selection signal SS. For example, a configuration of the first data and the second data constituting one symbol may be changed according to arrangement of the memory cells MC in the memory cell array 300. In a first example, the selected memory cell row may be coupled to an even word-line. In a second example, the selected memory cell row may be coupled to an odd word-line.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a. The mode resistor 212 may be programmed by mode resistor set (MRS) commands. The mode resistor 212 may generate mode signal according to programmed operation mode.

For example, the command decoder 211 may generate the control signals corresponding to the command CMD by decoding a write enable signal (/WE), a row address strobe signal (/RAS), a column address strobe signal (/CAS), a chip select signal (/CS), etc.

FIGS. 4A to 4E are circuit diagrams of examples of the memory cell in FIG. 3 according to at least one example embodiment.

Figure 4A:
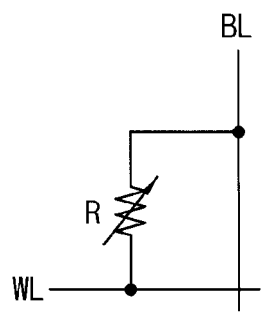
FIGS. 4A to 4E are circuit diagrams of examples of the memory cell in FIG. 3 according to at least one example embodiment.
Figure 4B:
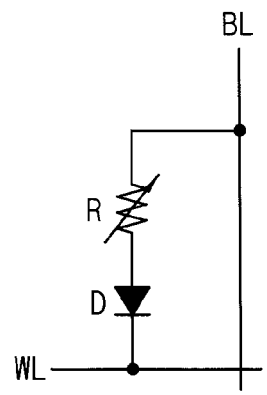
Figure 4C:
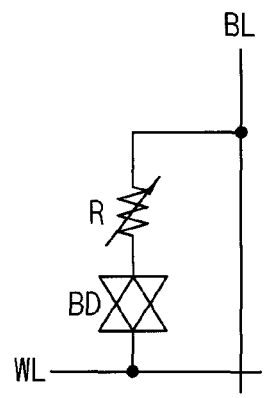
Figure 4D:
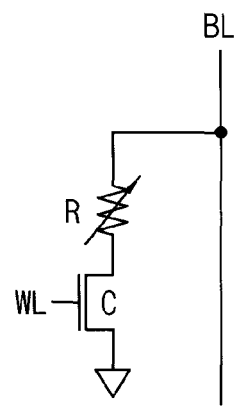
Figure 4E:
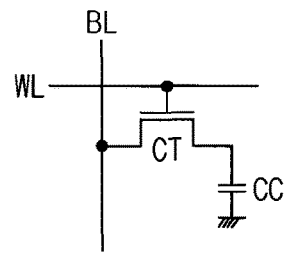

FIGS. 4A to 4D illustrate memory cells which are implemented with resistive type memory cells and FIG. 4E illustrates a memory cell which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element R connected to a bit-line BL and a word-line WL. Such a semiconductor memory cell having a structure without a selection element may store data by a voltage applied between bit-line BL and word-line WL.

Referring to FIG. 4B, a memory cell MC may include a resistive element R and a diode D. Resistive element R may include a resistive material for data storage. Diode D may be a selection element (or switching element) that supplies current to resistive element R or cuts off the current supply to resistive element R according to a bias of word-line WL and bit-line BL. Diode D may be coupled between resistive element R and word-line WL, and resistive element R may be coupled between bit-line BL and diode D. Positions of diode D and resistive element R may be interchangeable. Diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element R and a bidirectional diode BD. Resistive element R may include a resistive material for data storage. Bidirectional diode BD may be coupled between resistive element R and a word-line WL, and resistive element R may be coupled between a bit-line BL and bidirectional diode BD. Positions of bidirectional diode BD and resistive element R may be interchangeable. Bidirectional diode BD may block leakage current flowing to an unselected semiconductor memory cell.

Referring to FIG. 4D, a memory cell MC may include a resistive element R and a transistor T. Transistor T may be a selection element (or switching element) that supplies current to resistive element R or cuts off the current supply to resistive element R according to a voltage of a word-line WL. Transistor T may be coupled between resistive element R and a word-line, and resistive element R may be coupled between a bit-line BL and transistor T. Positions of transistor T and resistive element R may be interchangeable. The semiconductor memory cell may be selected or unselected depending on whether transistor T drive by word-line WL is turned on or turned off.

Referring to FIG. 4E, a memory cell MC may include a cell capacitor CC and a cell transistor CT. Cell Transistor CT may be a selection element (or switching element) that connects/disconnects cell capacitor CC to/from bit-line BL according to a voltage of a word-line WL. Cell transistor CT may be coupled between cell capacitor CC, a word-line WL and a bit-line BL, and a cell capacitor CC may be coupled between a cell transistor CT and a plate voltage (not illustrated).

Figure 5:
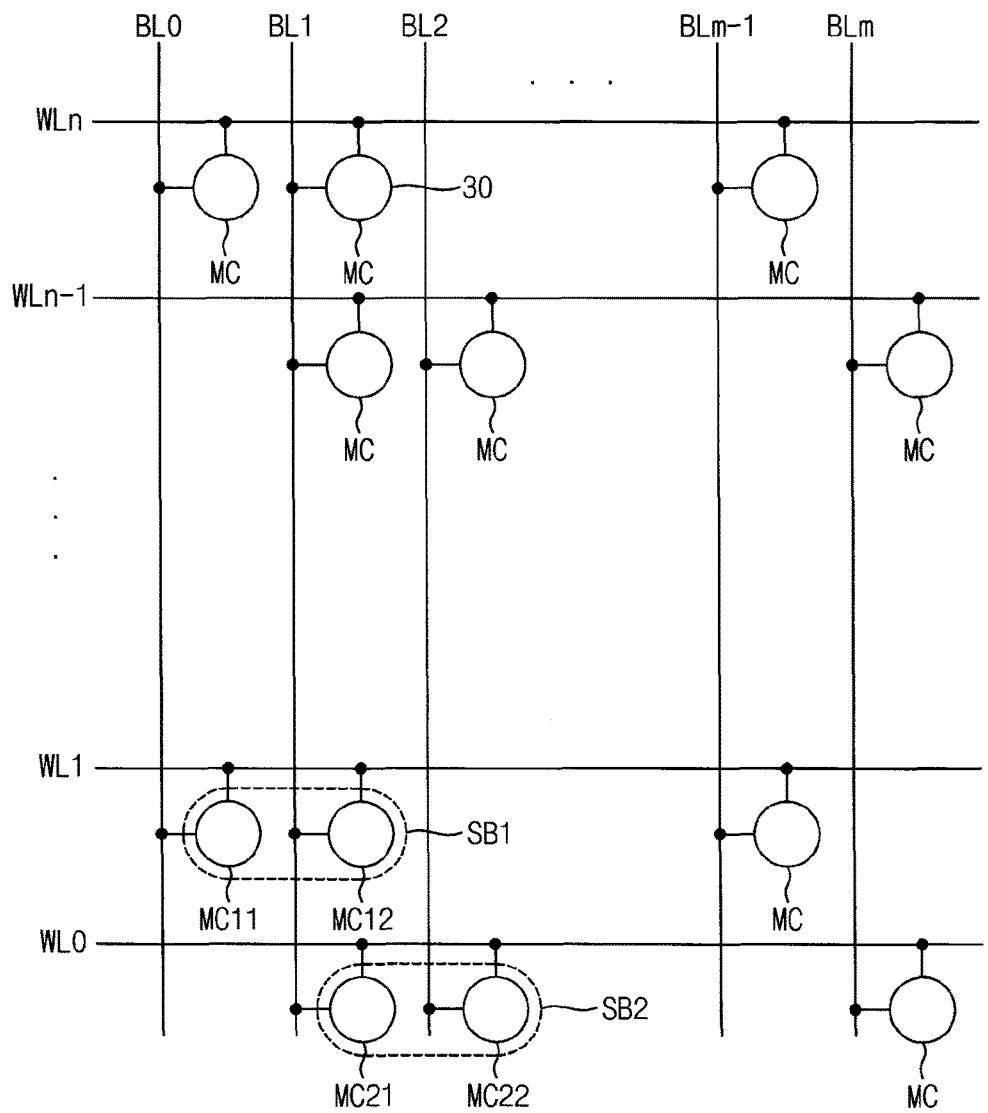
FIG. 5 illustrates an example of the first bank array in the semiconductor memory device of FIG. 3 according to at least one example embodiment.

FIG. 5 illustrates an example of the first bank array in the semiconductor memory device of FIG. 3 according to at least one example embodiment.

Referring to FIG. 5, the first bank array 310 may include a plurality of word-lines WL0 through WLn (where n is a natural number equal to or greater than 2), a plurality of bit-lines BL0 through BLm (where M is a natural number equal to or greater than 2), and a plurality of memory cells 30 disposed at intersections between the word-lines WL0 through WLn and the bit-lines BL0 through BLm. Each of the memory cells 30 may be a resistive type memory cell or a dynamic memory cell.

Configuration of the first data and the second data constituting one symbol may be changed according to which word-line is selected of the plurality of word-lines WL0 through WLn. For example, when a word-line WL1 is selected, one symbol SB1 may include a first data of a memory cell MC11 coupled to a bit-line BL0 and a second data of a memory cell MC12 coupled to a bit-line BL1. For example, when a word-line WL0 is selected, one symbol SB2 may include a first data of a memory cell MC21 coupled to a bit-line BL1 and a second data of a memory cell MC22 coupled to a bit-line BL2.

Figure 6:
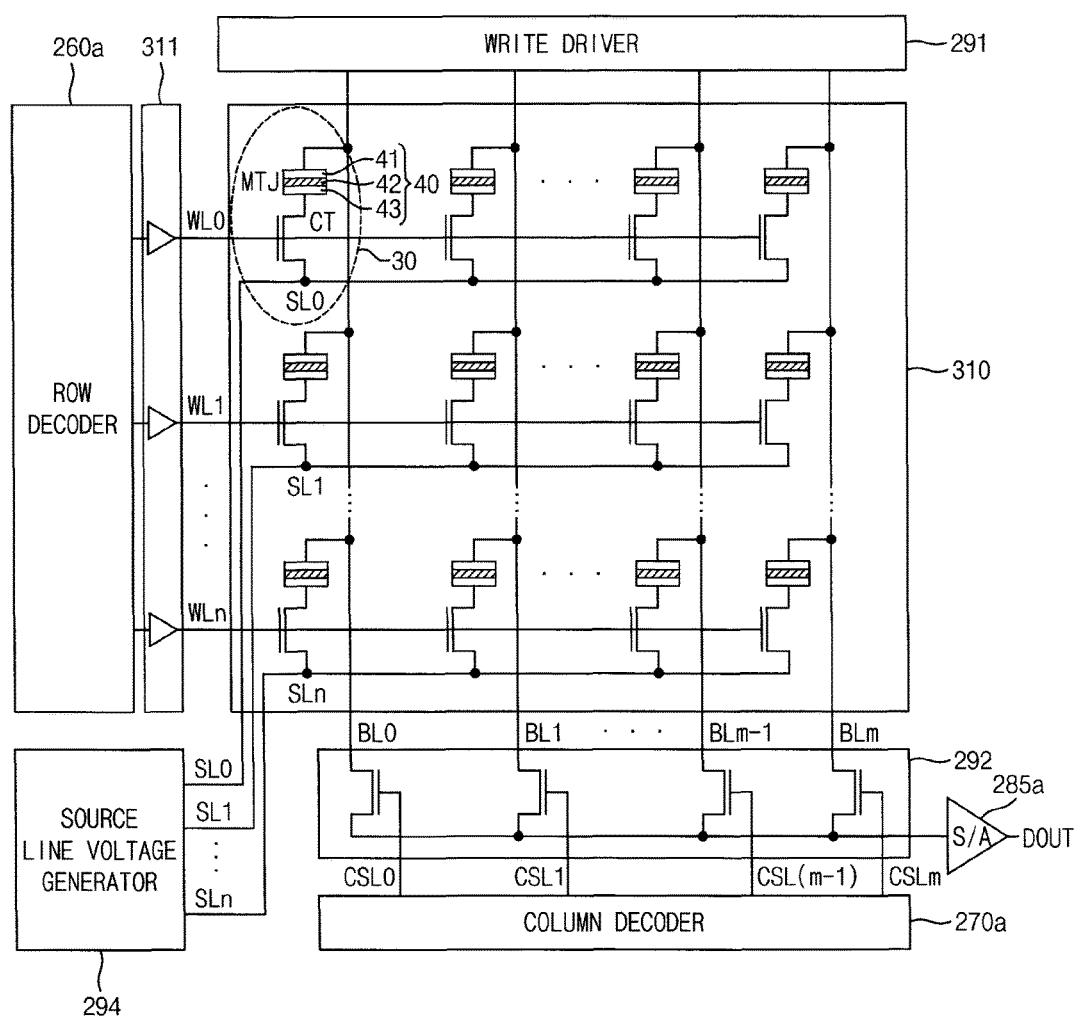
FIG. 6 illustrates an example of the first bank array in the semiconductor memory device of FIG. 3 according to at least one example embodiment.

FIG. 6 illustrates an example of the first bank array in the semiconductor memory device of FIG. 3 according to at least one example embodiment.

Referring to FIG. 6, the first bank array 310 may include a plurality of word-lines WL0 through WLn (where n is a natural number equal to or greater than 2), a plurality of bit-lines BL0 through BLm (where M is a natural number equal to or greater than 1), a plurality of source lines SL0 through SLn, and a plurality of resistive type memory cells 30 disposed at intersections between the word-lines WL0 through WLn and the bit-lines BL0 through BLm. Each of the resistive type memory cells 30 may be an STT-MRAM cell. The resistive type memory cell 30 may include an MTJ element 40 having a magnetic material.

Each of the resistive type memory cells 30 may include a cell transistor CT and the MTJ element 40. In one resistive type memory cell 30, a drain (a first electrode) of the cell transistor CT may be connected to a pinned layer 43 of the MTJ element 40. A free layer 41 of the MTJ 40 may be connected to the bit-line BL0, and a source (a second electrode) of the cell transistor CT may be connected to the source line SL0. A gate of the cell transistor CT may be connected to the word-line WL0.

The MTJ element 40 may be replaced by a resistive device such as a phase change random access memory (PRAM) using a phase change material, a resistive random access memory (RRAM) using a variable resistive material such as a complex metal oxide, or a magnetoresistive random access memory (MRAM) using a ferromagnetic material. Materials forming the resistive devices have resistance values that vary according to a size and/or a direction of a current or a voltage, and are nonvolatile and thus may maintain the resistance values even when the current or the voltage is cut off.

The word-line WL0 may be enabled by a row decoder 260a, and may be connected to a word-line driver 311 that drives a word-line selection voltage. The word-line selection voltage activates the word-line WL0 in order to read or write a logic state of the MTJ element 40.

The source line SL0 is connected to a source line voltage generator 294. The source line voltage generator 294 may receive and decode an address signal and a read/write signal, and may generate a source line selection signal in the selected source line SL0. A ground reference voltage may be supplied to the unselected source lines SL1 through SLn.

The bit-line BL0 is connected to a column select circuit 292 that is driven by column selection signals CSL0 through CSLm. The column selection signals CSL0 through CSLm are selected by a column decoder 270a. For example, the selected column selection signal CSL0 turns on a column select transistor in the column selection circuit 292, and selects the bit-line BL0. A logic state of the MTJ element 40 is read from the bit-line BL0 through a sense amplifier 285a. Alternatively, a write current applied through the write driver 291 is transmitted to the selected bit-line BL0 and is written to the MTJ element 40.

Figure 7:
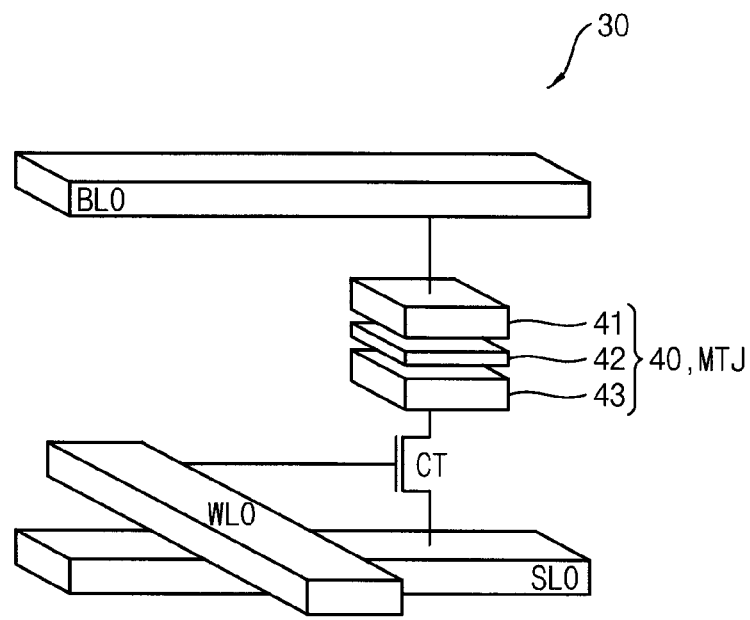
FIG. 7 is a perspective view illustrating the resistive type memory cell (referred to as STT-MRAM cell) in FIG. 6 according to at least one example embodiment.

FIG. 7 is a perspective view illustrating the resistive type memory cell (referred to as STT-MRAM cell) in FIG. 6 according to at least one example embodiment.

Referring to FIG. 7, the STT-MRAM cell 30 may include the MTJ element 40 and the cell transistor CT. A gate of the cell transistor CT is connected to a word-line (for example, the word-line WL0), and one electrode of the cell transistor CT is connected through the MTJ 40 to a bit-line (for example, the bit-line BL0). Also, the other electrode of the cell transistor CT is connected to a source line (for example, the source line SL0).

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL0 to turn on the cell transistor CT. A program current, that is, a write current is applied to the bit-line BL0 and the source line SL0. A direction of the write current is determined by a logic state of the MTJ element 40.

In order to perform a read operation of the STT-MRAM cell 30, a logic high voltage is applied to the word-line WL0 to turn on the cell transistor CT, and a read current is supplied to the bit-line BL0 and the source line SL0. Accordingly, a voltage is developed at both ends of the MTJ element 40, is detected by the sense amplifier 285*a*, and is compared with a reference voltage from a reference voltage to determine a logic state of the MTJ element 40. Accordingly, data stored in the MTJ element 40 may be detected.

Figure 8A:
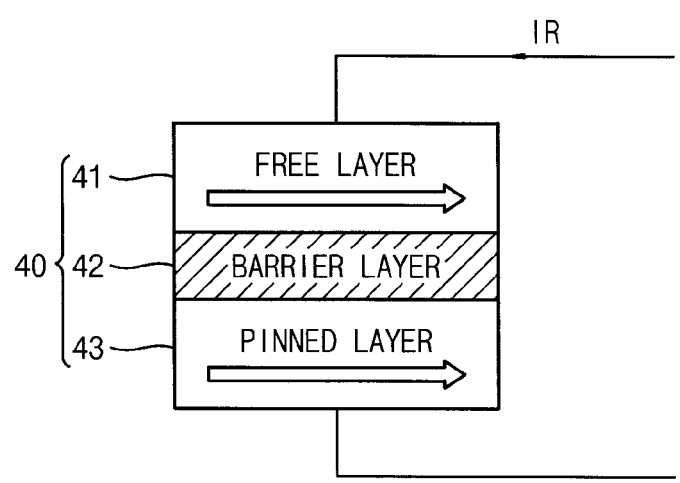
FIGS. 8A and 8B are block diagrams for explaining a magnetization direction according to data written to the MTJ element of FIG. 7.
Figure 8B:
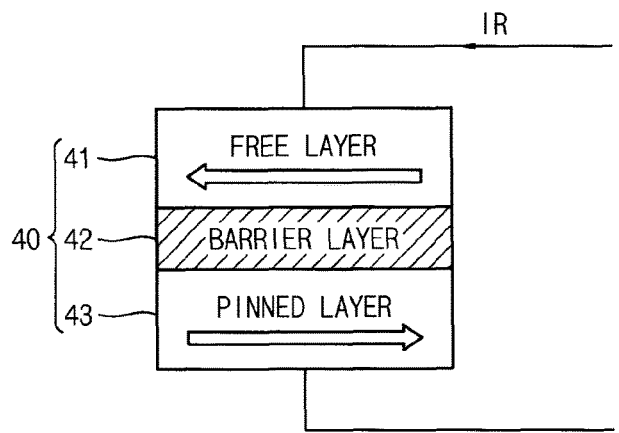

FIGS. 8A and 8B are block diagrams for explaining a magnetization direction according to data written to the MTJ element of FIG. 7.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 8A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 8B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ 40 are horizontal magnetic layers, example embodiments are not limited thereto and the free layer 41 and the pinned layer 43 may be, for example, vertical magnetic layers.

Figure 9:
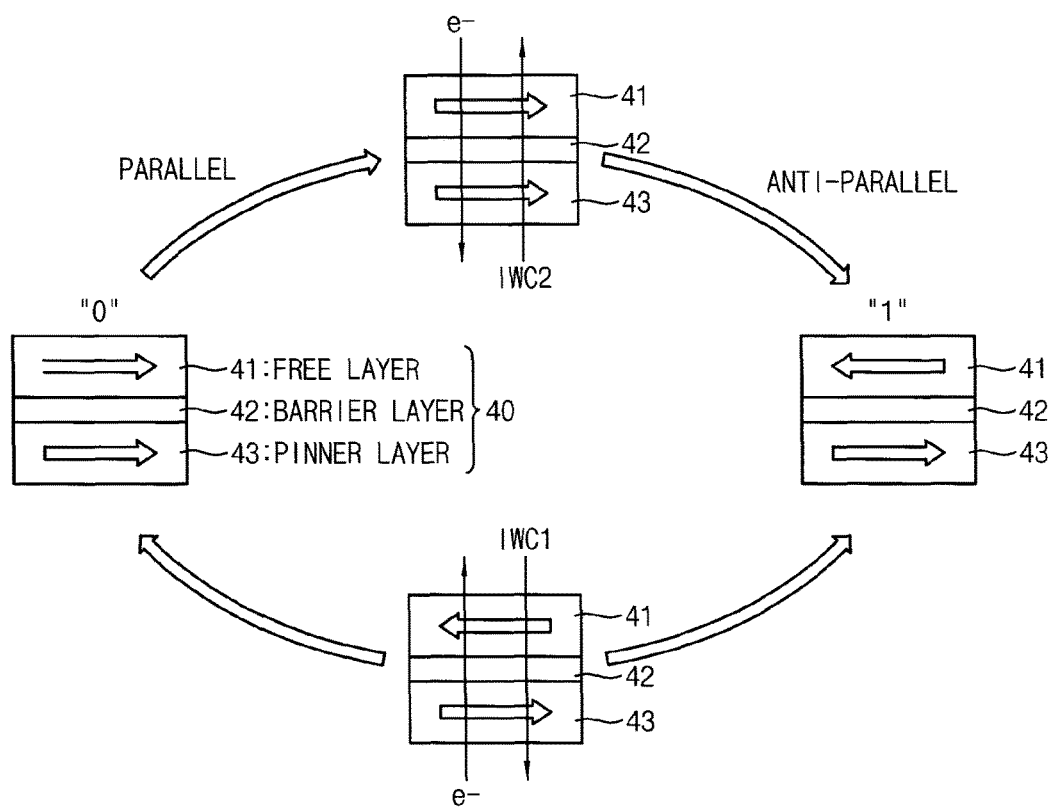
FIG. 9 is a block diagram for explaining a write operation of the STT-MRAM cell of FIG. 7 according to at least one example embodiment.

FIG. 9 is a block diagram for explaining a write operation of the STT-MRAM cell of FIG. 7 according to at least one example embodiment.

Referring to FIG. 9, a magnetization direction of the free layer 41 may be determined based on a direction of a write current IW flowing through the MTJ 40. For example, when a first write current IWC1 is supplied from the free layer 41 to the pinned layer 43, free electrons having the same spin direction as that of the pinned layer 43 apply a torque to the free layer 41. Accordingly, the free layer 41 may be magnetized parallel to the pinned layer 43.

When a second write current IWC2 is applied from the pinned layer 43 to the free layer 41, electrons having a spin direction opposite to that of the pinned layer 41 return to the free layer 43 and apply a torque. Accordingly, the free layer 41 may be magnetized anti-parallel to the pinned layer 43. That is, a magnetization direction of the free layer 41 of the MTJ 40 may be changed by an STT.

Figure 10:
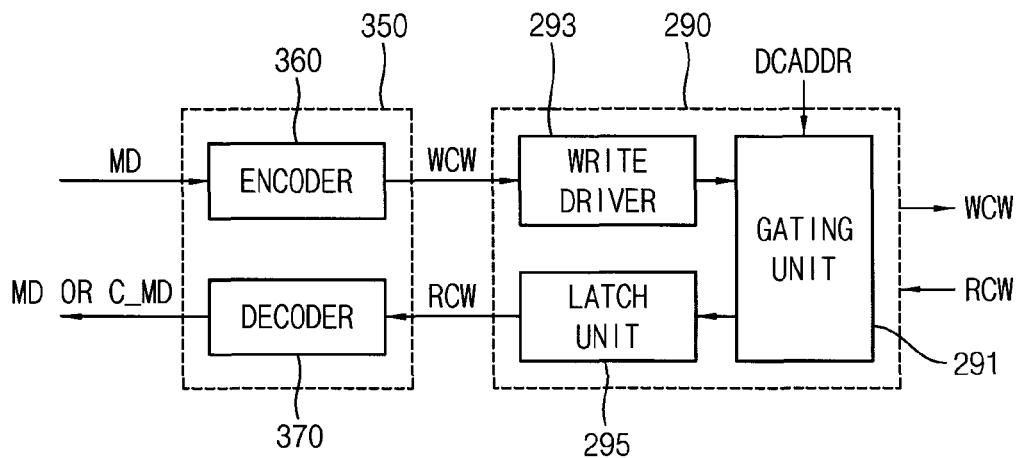
FIG. 10 illustrates the ECC circuit and the I/O gating circuit in the semiconductor memory device of FIG. 3 according to at least one example embodiment.

FIG. 10 illustrates the ECC circuit and the I/O gating circuit in the semiconductor memory device of FIG. 3 according to at least one example embodiment.

Referring to FIG. 10, the ECC circuit 350 includes an encoder 360 and a decoder 370. The I/O gating circuit 290 includes a gating unit 291, a write driver 293 and a latch unit 295.

The encoder 360 may receive the $2^p$-bit main data MD from the memory controller 100, may encode the main data MD to generate q-bit parity data and may provide the I/O gating circuit 290 with a write codeword WCW including the main data MD and the parity data in a write operation, where q is greater than p and p and q are natural numbers equal to or greater than two). The decoder 370 may receive the codeword (or a read codeword) RCW from the I/O gating circuit 290, may generate the check bits using the main data MD in the codeword RCW, may generate the syndromes (or error indicators) based on the check bits and the parity data in the codeword RCW and may correct errors in the codeword RCW, where a first data of a first memory cell of the selected memory cell row and a second data of a second memory cell of the selected memory cell row are assigned to one symbol (a same symbol). The first memory cell and the second memory cell may be adjacent to each other. The decoder 370 may correct the errors when the one symbol includes errors equal to or smaller than two.

The gating unit 291 gates the write codeword WCW from the write driver 293 to the memory cell array 300 in response to a decoded column address DCADDR and gates the read codeword RCW from the memory cell array 300 to the latch unit 295. The latch unit 295 provides the decoder 370 with the read codeword RCW from the memory cell array 300.

Figure 11:
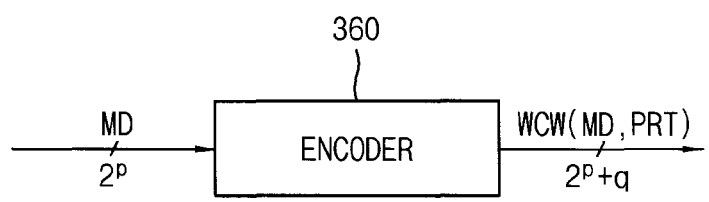
FIG. 11 illustrates an example of the ECC circuit in FIG. 10 according to at least one example embodiment.
Figure 11:
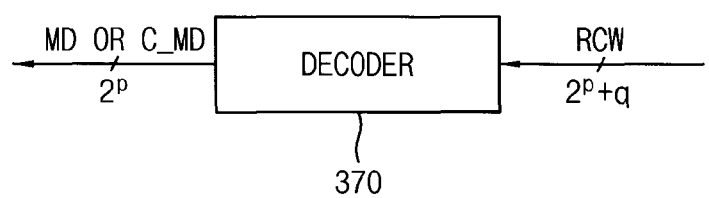

FIG. 11 illustrates an example of the ECC circuit in FIG. 10 according to at least one example embodiment.

Referring to FIG. 11, the encoder 360 may encode the $2^p$-bit main data MD to generate the q-bit parity data PRT and provide the write driver 293 with the write codeword WCW including the $2^p$-bit main data MD and the q-bit parity data PRT. The decoder 370 may receive the $(2^p+q)$-bit read codeword RCW from the latch unit 295, may correct errors in the read codeword RCW on a per symbol basis and may provide the memory controller 100 with the $2^p$-bit main data MD or $2^p$-bit corrected main data C_MD via the data I/O buffer 299.

Figure 12:
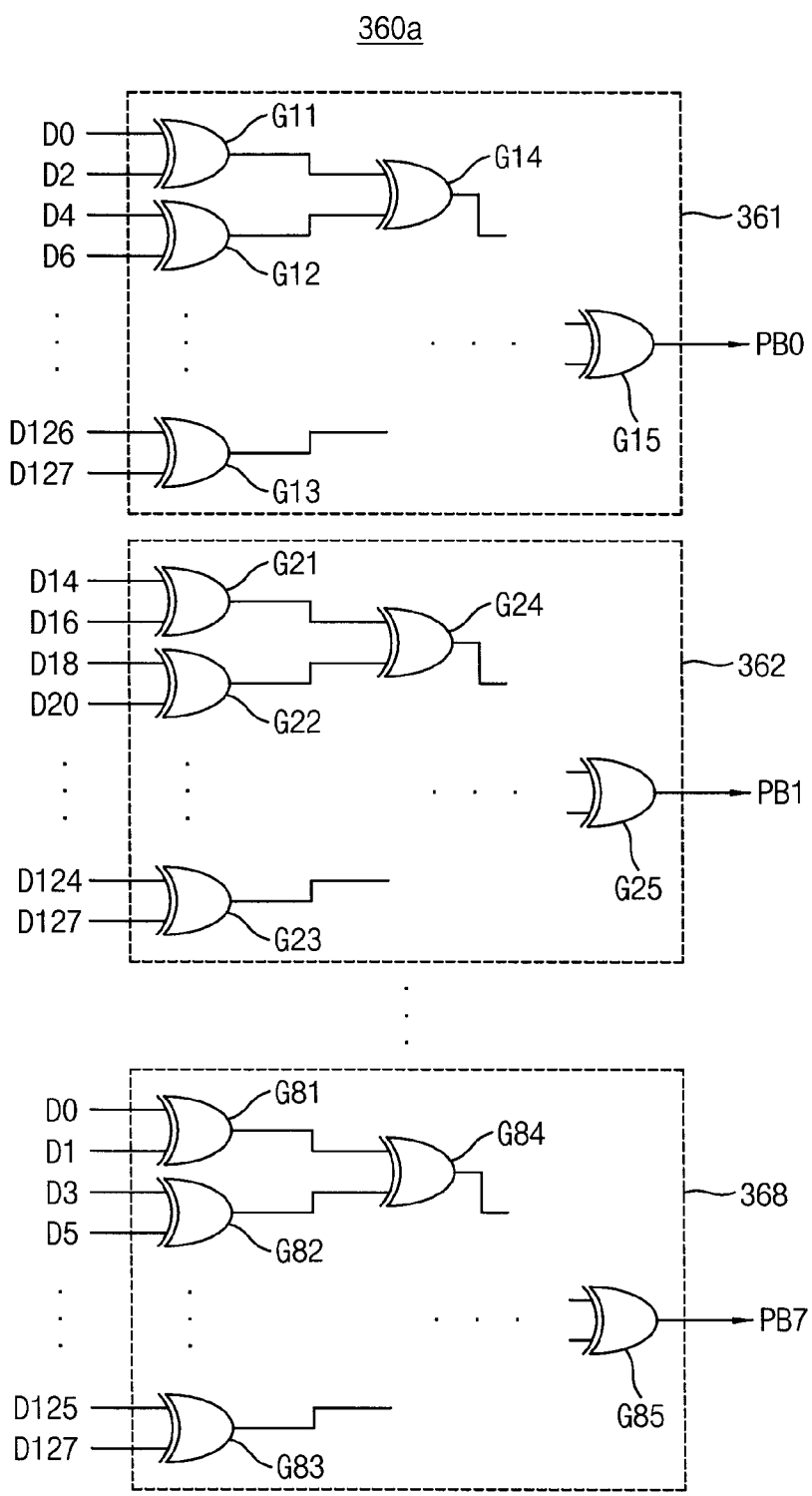
FIG. 12 is a circuit diagram illustrating an example of the encoder in FIG. 11 according to at least one example embodiment.

FIG. 12 is a circuit diagram illustrating an example of the encoder in FIG. 11 according to at least one example embodiment.

In FIG. 12, it is assumed that the main data MD includes $2^7$ bits, or 128 bits and the parity data PRT includes 8 bits PB0~PB7.

Referring to FIG. 12, the encoder 360*a* may include a plurality of parity generators 361~368.

The plurality of parity generators 361~368 may generate the parity bits PB0~PB7 of the q-bit parity data PRT based on the $2^p$-bit main data MD, respectively.

The parity generator 361 may generate a first parity bit PB0 based on data bits D0, D2, ..., D127 of the main data MD, and the parity generator 361 may include a plurality of XOR gates G11~G15. The parity generator 362 may generate a second parity bit PB1 based on data bits D14, D16, ..., D127 of the main data MD, and the parity generator 362 may include a plurality of XOR gates G21~G25. The parity generator 368 may generate an eighth parity bit PB7 based on data bits D0, D1, ..., D127 of the main data MD, and the parity generator 368 may include a plurality of XOR gates G81~G85.

Each of the parity generators 361~368 may include other logic gates performing same operation as XOR gates. The parity bits PB0~PB7 are stored in the selected memory cell row along with the main data MD.

Figure 13:
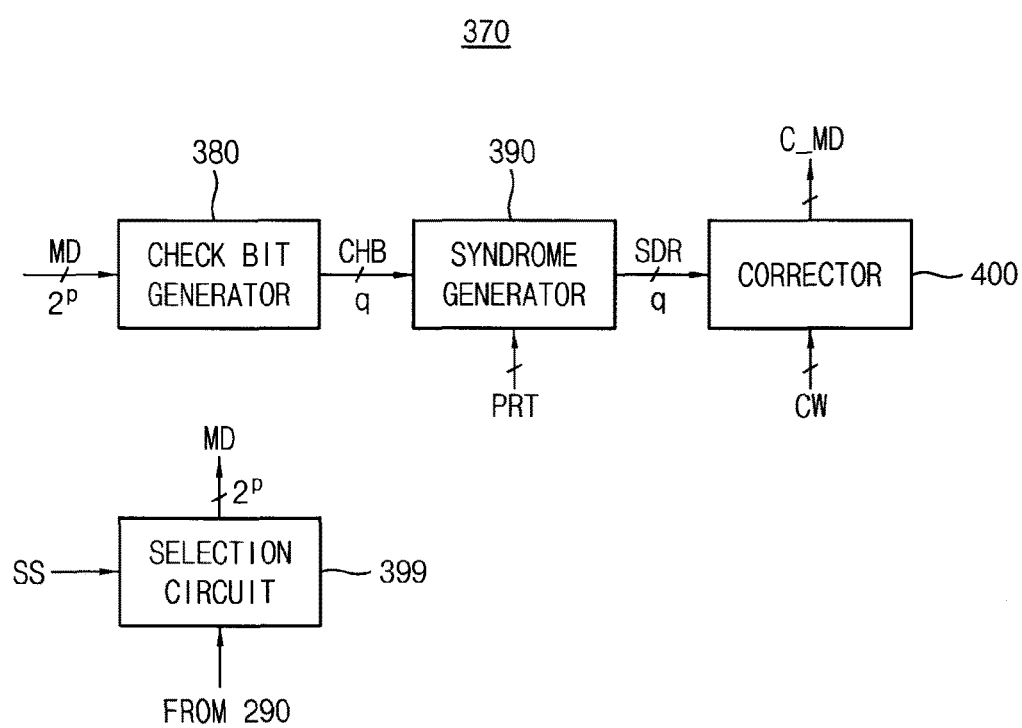
FIG. 13 is a block diagram illustrating an example of the decoder in FIG. 11 according to at least one example embodiment.

FIG. 13 is a block diagram illustrating an example of the decoder in FIG. 11 according to at least one example embodiment.

Referring to FIG. 13, the decoder 370 may include a check bit generator 380, a syndrome generator 390, a corrector 400 and a selection circuit 399.

The check bit generator 380 may generate q-bit check bits CHB based on the $2^p$-bit main data MD in the read codeword CW. The syndrome generator 390 may generate q-bit syndromes (or error indicators) SDR based on the q-bit check bits CHB and the q-bit parity data PRT in the read codeword CW. The corrector 400 may correct errors in the read codeword CW on a per symbol basis based on the q-bit syndromes SDR to output corrected main data C_MD. The selection circuit 399 may change the configuration of a first data and a second data in the one symbol to be provided to the check bit generator 380, in response to the selection signal SS.

Figure 14:
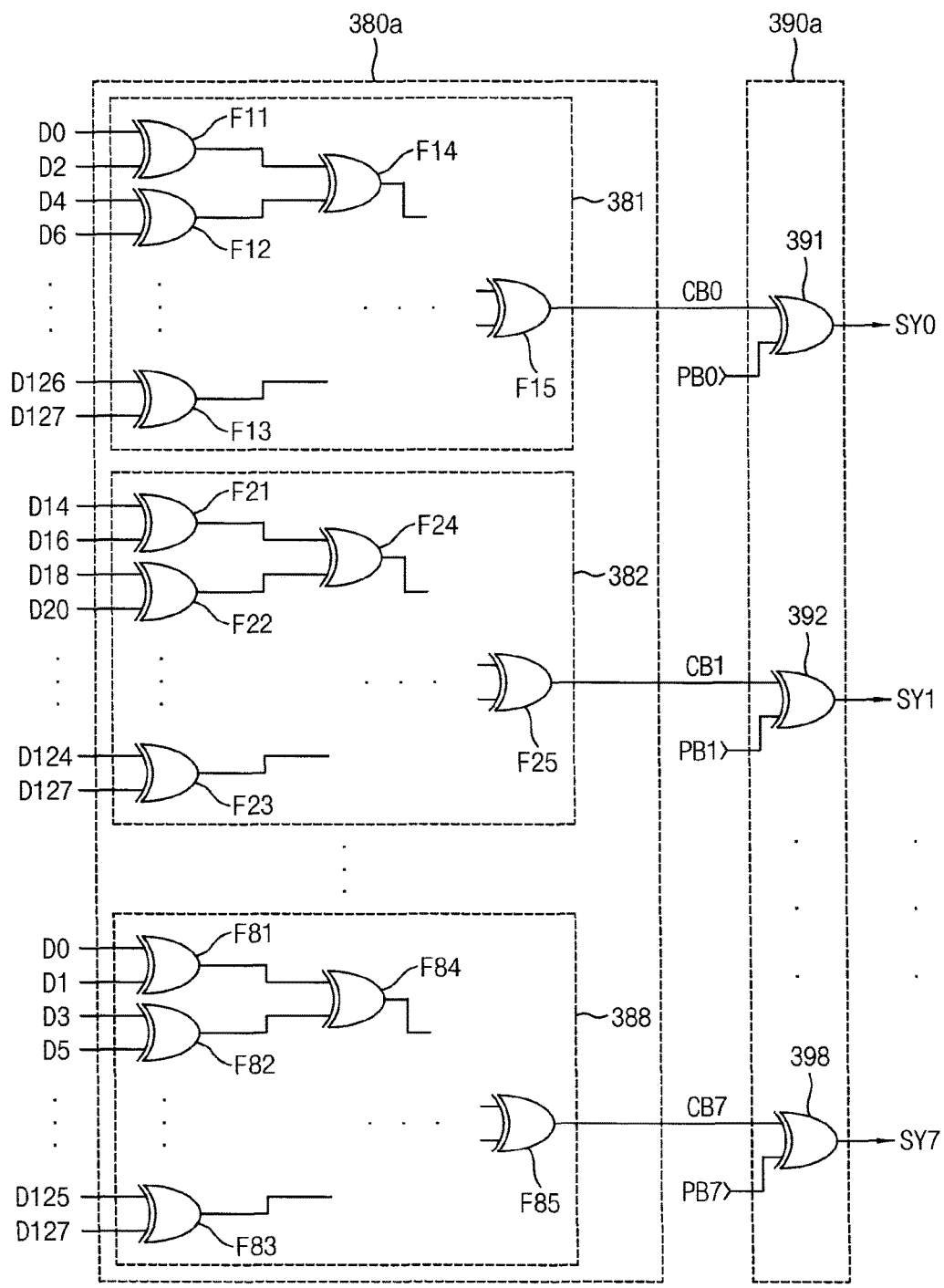
FIG. 14 is a circuit diagram illustrating examples of the check bit generator and the syndrome generator in FIG. 13.

FIG. 14 is a circuit diagram illustrating examples of the check bit generator and the syndrome generator in FIG. 13.

In FIG. 14, it is assumed that the main data MD includes $2^7$ bits, or 128 bits, the check bits CHB include 8 bits CB0~CB7 and the syndromes (or error indicators) SDR include 8 bits SY0~SY7.

Referring to FIG. 14, the check bit generator 380a may include a plurality of unit check bit generators 381~388.

The plurality of unit check bit generators 381~388 may generate the check bits CB0~CB7 of the q-bit check bits CB based on the $2^p$-bit main data MD, respectively.

The unit check bit generator 381 may generate a first check bit CB0 based on data bits D0, D2, ..., D127 of the main data MD, and the unit check bit generator 381 may include a plurality of XOR gates F11~F15. The unit check bit generator 382 may generate a second check bit CB1 based on data bits D14, D16, ..., D127 of the main data MD, and the unit check bit generator 382 may include a plurality of XOR gates F21~F25. The unit check bit generator 388 may generate an eighth check bit CB7 based on data bits D0, D1, ..., D127 of the main data MD, and the unit check bit generator 388 may include a plurality of XOR gates F81~F85.

Each of the check bit generators 381~388 may include other logic gates performing same operations as XOR gates.

The syndrome generator 390a may include a plurality of XOR gates 391~398. Each of the XOR gates 391~398 may perform an XOR operation on each of the check bits CB0~CB7 of the q-bit check bits CB and corresponding bit of the parity bits PB0~PB7 to output each of the syndromes SY0~SY7. Therefore, the syndrome generator 390a may generates the syndromes SY0~SY7 each having a logic level that indicates whether corresponding bits of the q-bit check bits CB and the parity bits PB0~PB7 are same with respect to each other. For example, when the check bit CB0 and the parity bit PB are same with respect to each other, the syndrome SY0 has a first logic level (low level) and when the check bit CB0 and the parity bit PB are different from each other, the syndrome SY0 has a second logic level (high level).

Figure 15:
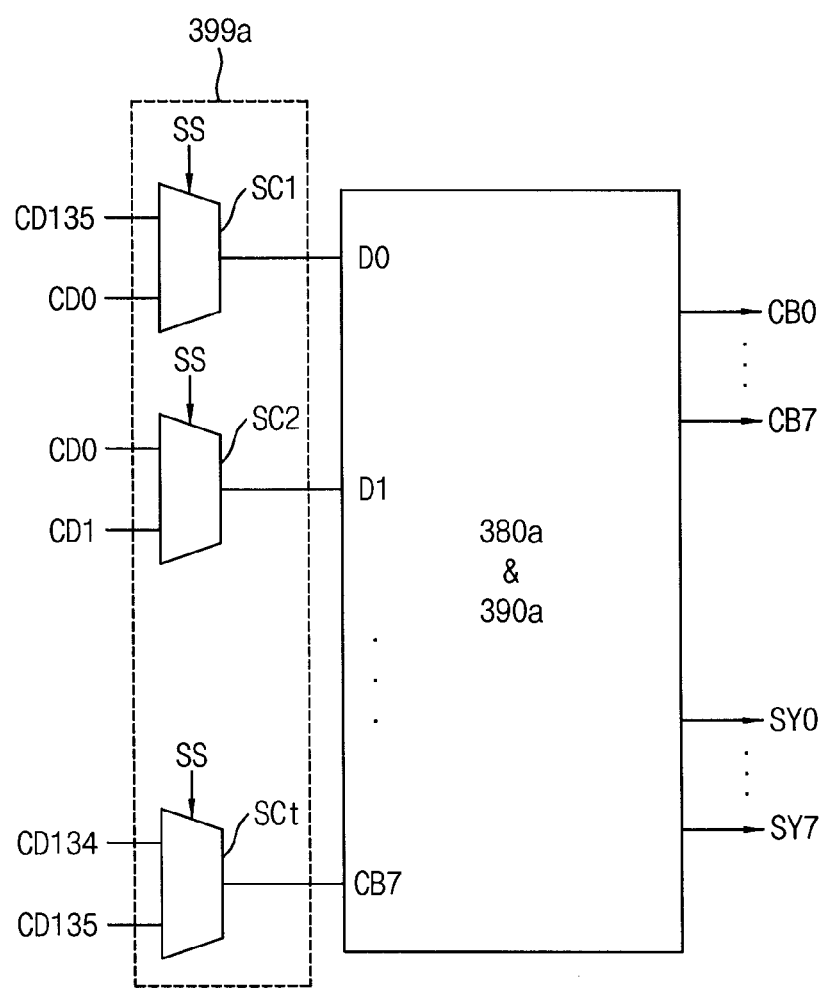
FIG. 15 illustrates the selection circuit, the check bit generator and the syndrome generator in FIG. 13 according to at least one example embodiment.
Figure 16A:
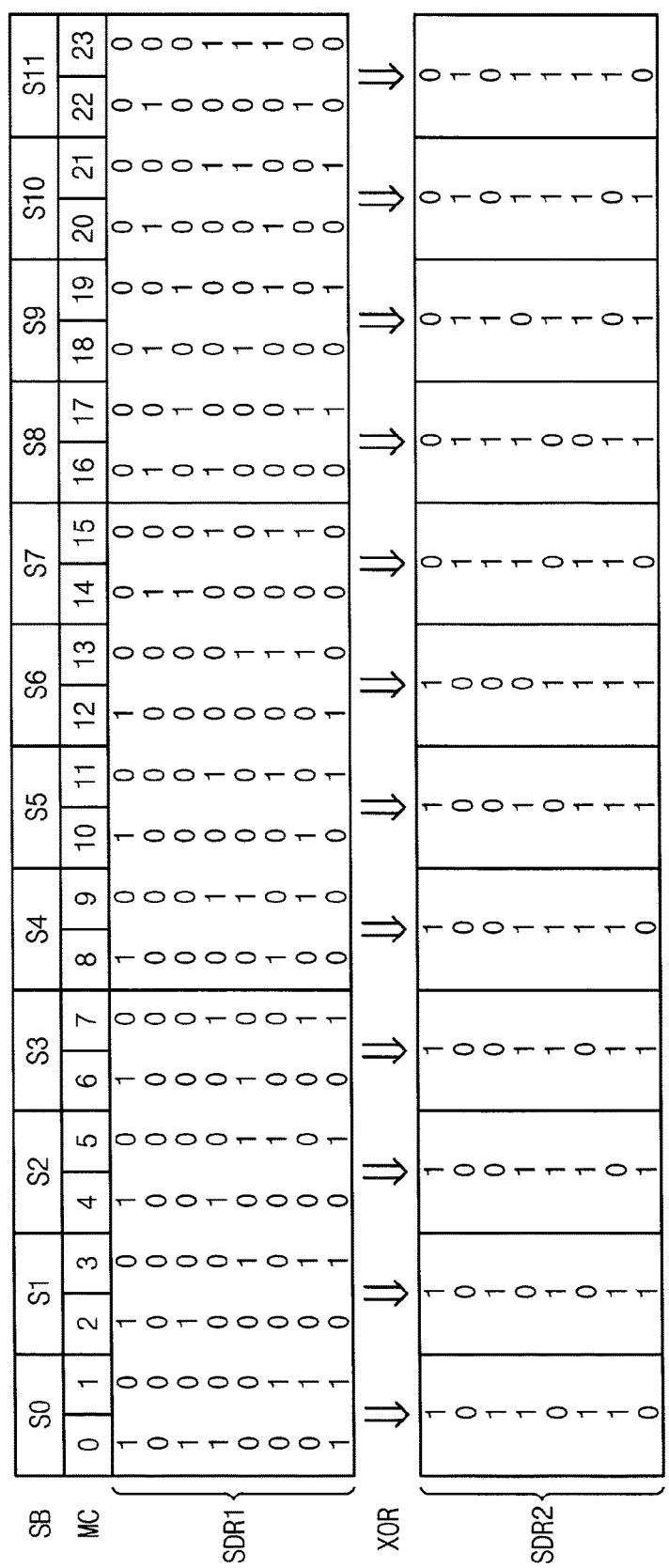
Figure 16C:
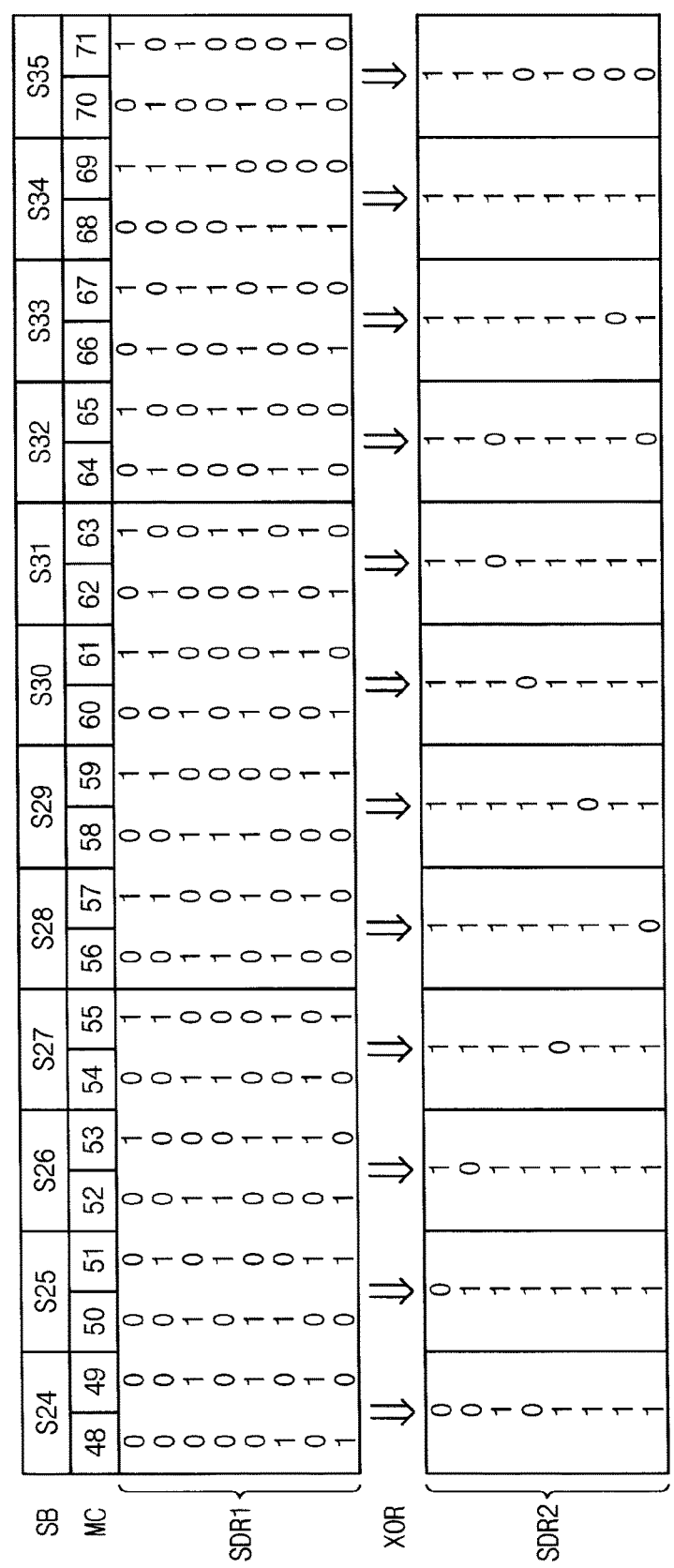
Figure 16D:
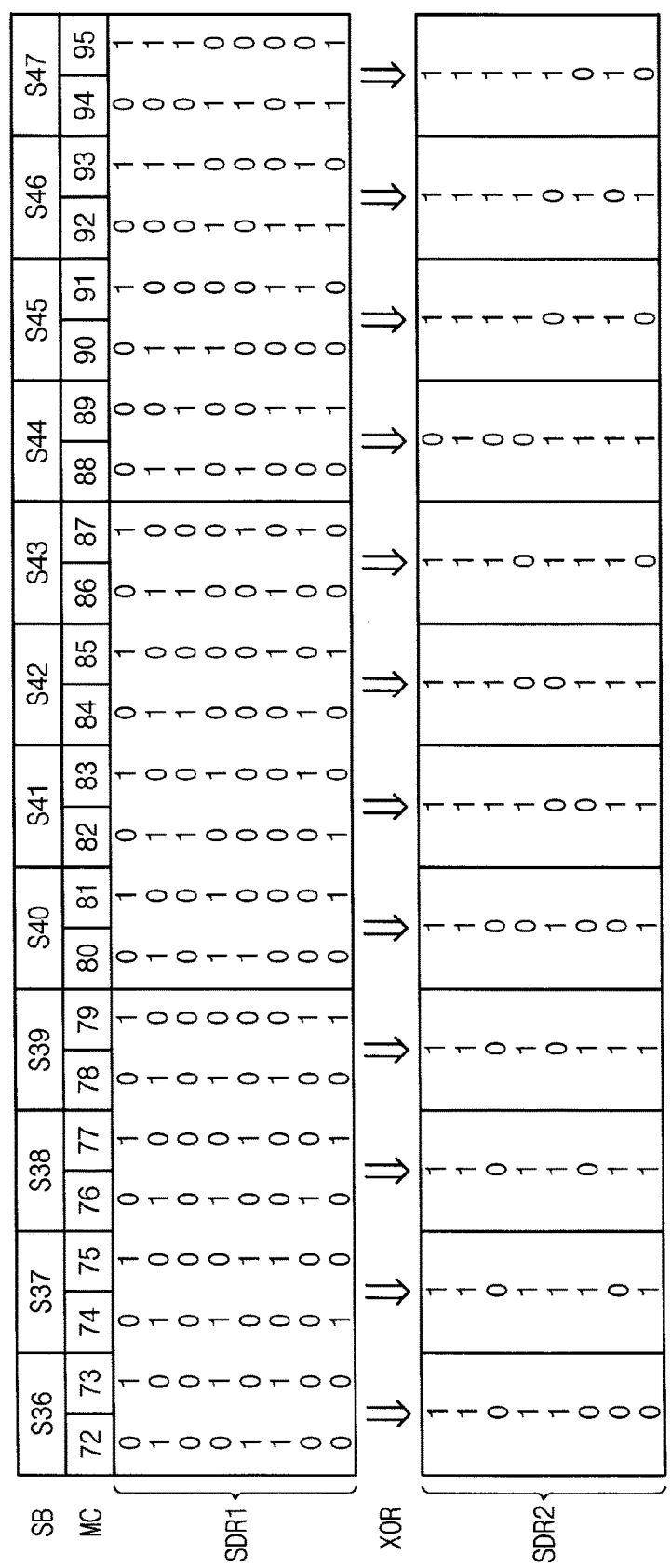
Figure 16E:
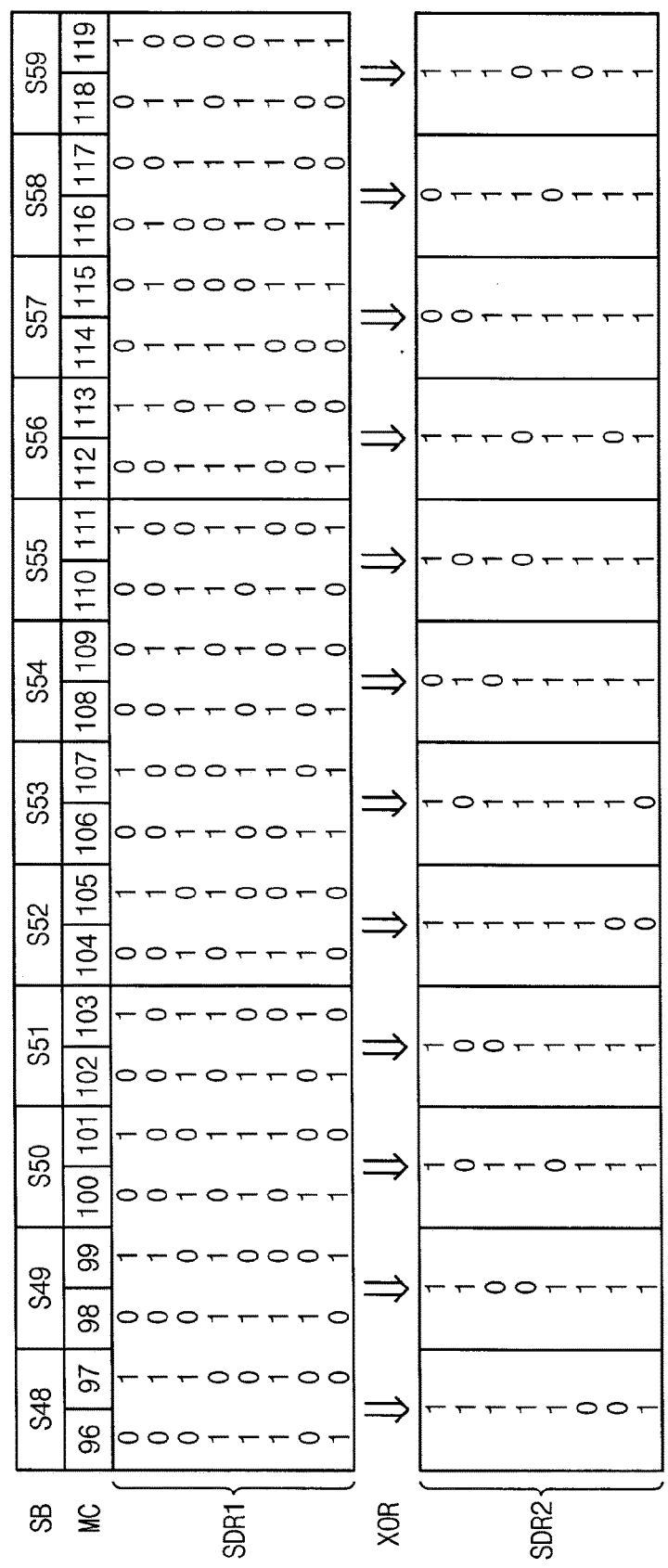
Figure 16F:
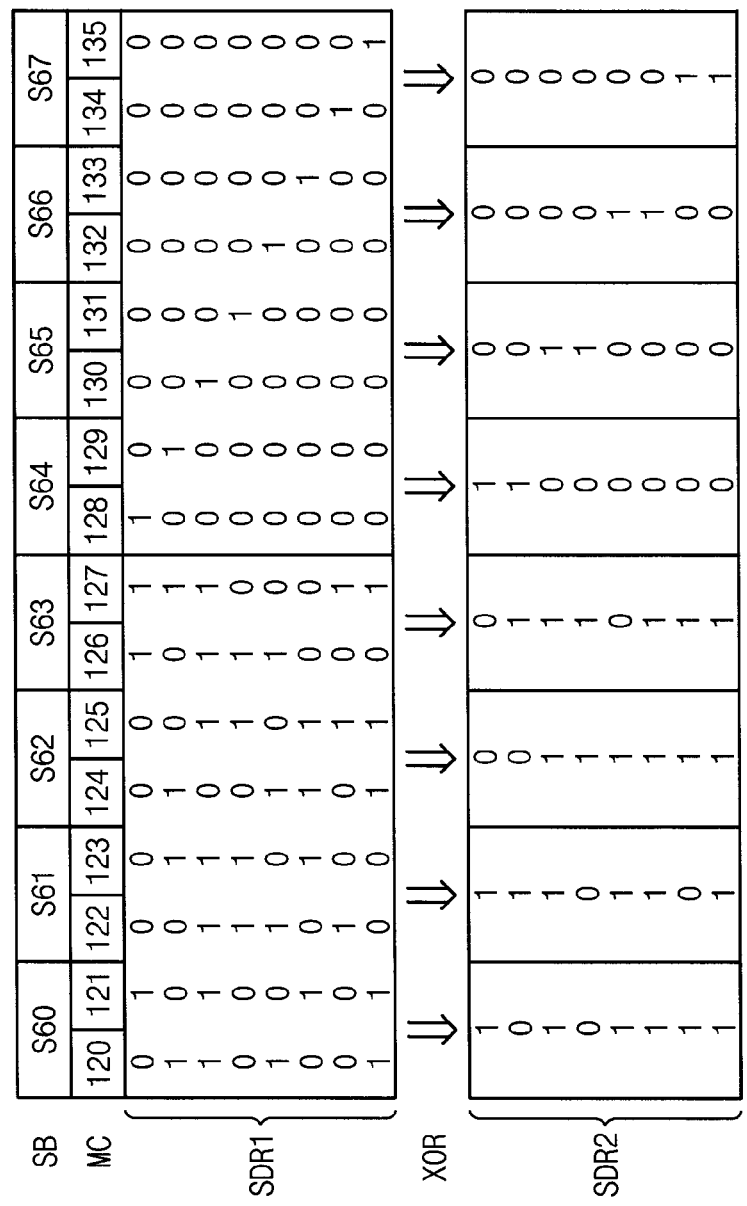

FIG. 15 illustrates the selection circuit, the check bit generator and the syndrome generator in FIG. 13 according to at least one example embodiment.

In FIG. 15, it is assumed that 128-bit main data MD and 8-bit parity data PRT are stored in the selected memory cell row.

Referring to FIG. 15, a selection circuit 399a may include a plurality of selection elements SC1~SCt (where, t is a natural number greater than 2), and each of the selection elements SC1~SCt may be implemented with a multiplexer. The selection element SC1 may select one of cell data CD135 and CD0 in response to the selection signal SS to output a first data D0. The selection element SC2 may select one of cell data CD0 and CD1 in response to the selection signal SS to output a second data D1. The selection element SCt may select one of cell data CD134 and CD135 in response to the selection signal SS to output the check bit CB7. As described with reference to FIG. 5, the configuration of the first data and the second data constituting one symbol may be changed based on whether an even word-line or an odd word-line is selected of the plurality of word-lines WL0 through WLn. For example, when the selection signal SS has a first logic level, the first data D0 and the second data D1 in one symbol may include the cell data CD135 and CD0. For example, when the selection signal SS has a second logic level, the first data D0 and the second data D1 in one symbol may include the cell data CD0 and CD1.

FIGS. 16A through 16F are matrixes respectively illustrating values of the syndromes according to at least one example embodiment.

In FIGS. 16A through 16F, it is assumed that the main data MD includes $2^7$ (=128) bits, each syndrome (or error indicator) SDR includes 8 bits, and thus, the symbols S0~S67 correspond to 68. Each syndrome (or error indicator) SDR1 represents bit values of the syndrome when one memory cell MC includes one error, and each syndrome (or error indicator) SDR2 represents bit values of the syndrome when first and second data of adjacent two memory cells are assigned to one symbol and the each of the adjacent two memory cells has one error. The syndrome SDR1 for one datum in a symbol (e.g., first data D0 in symbol S0) in FIG. 16A may be referred to as a first sub-error indicator while the syndrome SDR1 for another datum in the symbol (e.g., second data D1 in symbol S0) may be referred to as a second sub-error indicator.

In FIGS. 16A through 16F, the bit values of the syndrome SDR1 and the bit values of the syndrome SDR2 are linearly independent with respect to each other. Therefore, it is noticeable which memory cell or which symbol has an error (or errors) by decoding the syndrome SDR. In addition, the syndrome SDR2 may be obtained by performing XOR operation on two adjacent syndromes SDR1 corresponding to two adjacent memory cells having two errors. Thus, the bit values of the syndrome SDR2 may be same as the bit values of the syndrome SDR1 when only one of the two adjacent memory cells assigned to one symbol has one error. Therefore, it is noticeable whether one or two of the two adjacent memory cells assigned to one symbol has an error by decoding the syndrome SDR2.

Figure 17:
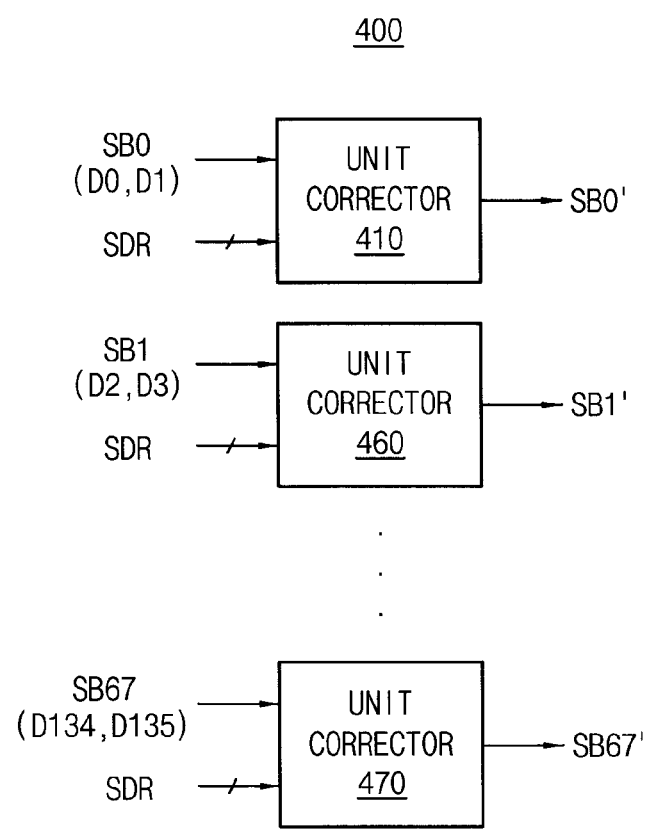
FIG. 17 is a block diagram illustrating an example of the corrector in FIG. 13 according to at least one example embodiment.

FIG. 17 is a block diagram illustrating an example of the corrector in FIG. 13 according to at least one example embodiment.

Referring to FIG. 17, the corrector 400 may include a plurality of unit correctors 410, 460, and 470. Each of the unit correctors 410, 460, and 470 may correct errors in each of the symbols SB0~SB7, which are equal to or smaller than 2 on a per symbol basis, based on the syndromes (or error indicators) SDR and may provide each of corrected symbols SB0'~SB67'.

Figure 18:
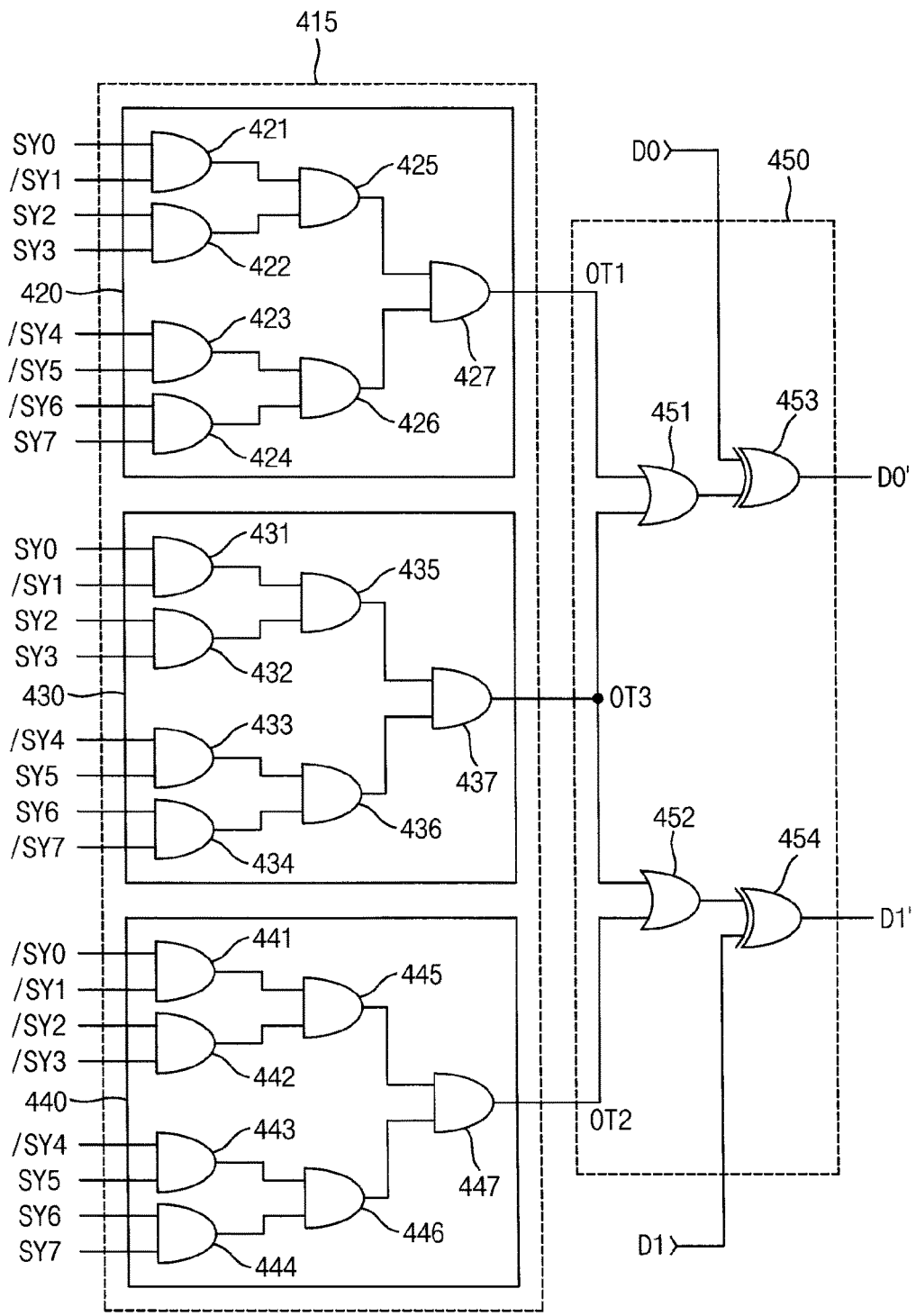
FIG. 18 is a circuit diagram illustrating an example of the corrector in FIG. 13 according to at least one example embodiment.

FIG. 18 is a circuit diagram illustrating an example of the corrector in FIG. 13 according to at least one example embodiment.

FIG. 18 illustrates the unit corrector 410 of the plurality of unit correctors 410, 460, and 470.

Referring to FIG. 18, the unit corrector 410 may include a symbol decoder 415 and a data corrector 450.

The symbol decoder 415 may determine whether at least one of the first and second data has an error based on the syndromes SDR. The data corrector 450 may correct errors in one symbol, which are equal to or smaller than two, based on first through third outputs of the symbol decoder 415.

The symbol decoder 415 may include first through third sub decoders 420, 440 and 430.

The first sub decoder 420 may generate a first output signal OT1 indicating whether the first data D0 has an error based on the syndromes SDR (e.g., syndromes SDR1 and SDR2 from FIGS. 16A-16F). The first sub decoder 420 may include a plurality of AND gates 421~427. The AND gate 421 receives syndrome values SY0 and /SY1, the AND gate 422 receives syndrome values SY2 and SY3, the AND gate 423 receives syndrome values /SY4 and /SY5 and the AND gate 424 receives syndrome values /SY6 and SY7. The AND gate 425 receives outputs of the AND gates 421 and 422, the AND gate 426 receives outputs of the AND gates 423 and 424 and the AND gate 427 receives outputs of the AND gates 425 and 426 to provide the first output signal OT1. Therefore, when the first data D0 has an error, the first output signal OT1 is a high level. It should be understood that syndrome values received by the first sub decoder 420 may be syndrome values from syndrome SDR1 for first data D0 in FIG. 16A.

The second sub decoder 440 may generate a second output signal OT2 indicating whether the second data D1 has an error based on the syndromes SDR. The second sub decoder 440 may include a plurality of AND gates 441~447. The AND gate 441 receives syndrome values /SY0 and /SY1, the AND gate 442 receives syndrome values /SY2 and /SY3, the AND gate 443 receives syndrome values /SY4 and SY5 and the AND gate 444 receives syndrome values SY6 and SY7. The AND gate 445 receives outputs of the AND gates 441 and 442, the AND gate 446 receives outputs of the AND gates 443 and 444 and the AND gate 447 receives outputs of the AND gates 445 and 446 to provide the second output signal OT1. Therefore, when the second data D1 has an error, the second output signal OT2 is a high level. It should be understood that syndrome values received by the second sub decoder 440 may be syndrome values from SDR1 for second data D1 in FIG. 16A.

The third sub decoder 430 may generate a third output signal OT3 indicating whether both the first data D0 and the second data D1 have errors based on the syndromes SDR. The third sub decoder 430 may include a plurality of AND gates 431~437. The AND gate 431 receives syndrome values SY0 and /SY1, the AND gate 432 receives syndrome values SY2 and SY3, the AND gate 433 receives syndrome values /SY4 and SY5 and the AND gate 434 receives syndrome values SY6 and /SY7. The AND gate 435 receives outputs of the AND gates 431 and 432, the AND gate 436 receives outputs of the AND gates 433 and 434 and the AND gate 437 receives outputs of the AND gates 435 and 436 to provide the third output signal OT3. Therefore, when both the first data D0 and the second data D1 have errors, the third output signal OT3 is a high level. It should be understood that syndrome values received by the third sub decoder 430 may be syndrome values from SDR2 for symbol Si in FIG. 16A.

The data corrector 450 may include OR gates 451 and 452 and XOR gates 453 and 454.

The OR gate 451 receives the first output signal OT1 and the third output signal OT3. The OR gate 452 receives the second output signal OT2 and the third output signal OT3. The XOR gate 453 performs an XOR operation on the first data D0 and an output of the OR gate 451 to output a corrected first data D0'. The XOR gate 454 performs an XOR operation on the second data D1 and an output of the OR gate 452 to output a corrected second data D1'.

The syndrome values SY0~SY7 input to the first through third sub decoders 420, 440 and 430 are independent with respect to each other. When the first data D0 has an error, only the first output signal OT1 is a high level. Therefore, when the first data D0 has an error, the data corrector 450 may invert the first data D0 to output the corrected first data D0'. When the second data D1 has an error, only the second output signal OT2 is a high level. Therefore, when the second data D1 has an error, the data corrector 450 may invert the second data D1 to output the corrected second data D1'. When both the first data D0 and the second data D1 have errors, only the third output signal OT3 is a high level. Therefore, when both the first data D0 and the second data D1 have errors, the data corrector 450 may invert both the first data D0 and the second data D1 to output the corrected first data D0' and the corrected second data D1'.

As fabrication processes of the semiconductor memory devices advance and the devices become smaller in size, errors in two adjacent memory cells in the memory cell array 300 may increase.

However, according to at least one example embodiment, two data of two adjacent memory cells are assigned to one symbol and one or two errors in the two adjacent memory cells having high probability of having errors are corrected by unit of the symbol. Therefore, a number of parity bits or check bits required for correcting errors may be reduced.

Figure 19:
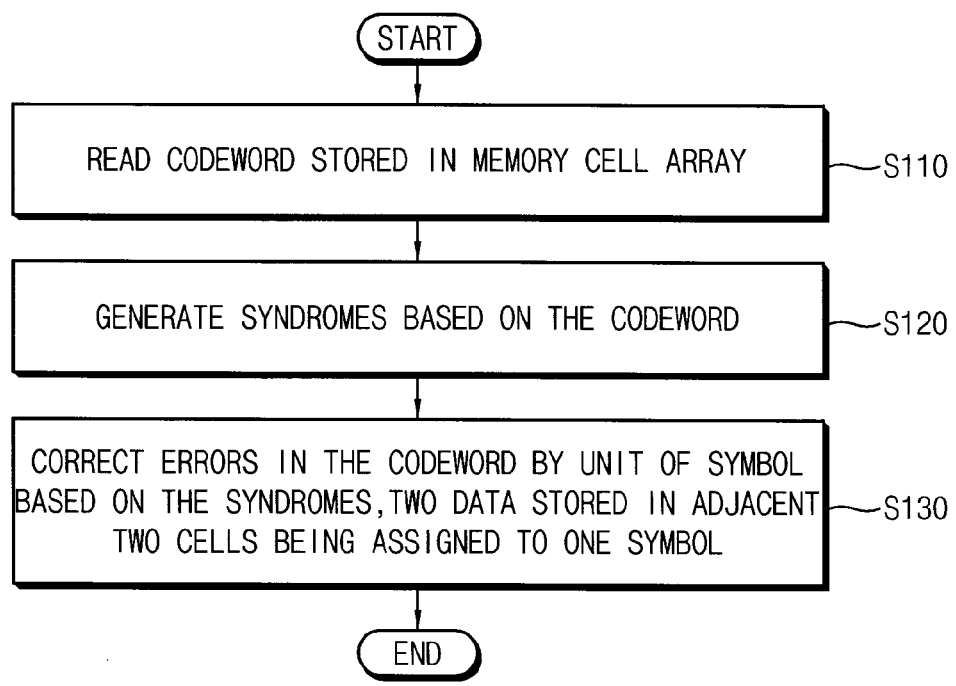
FIG. 19 is a flow chart illustrating a method of correcting errors in a semiconductor memory device according to at least one example embodiment.

FIG. 19 is a flow chart illustrating a method of correcting errors in a semiconductor memory device according to at least one example embodiment.

Hereinafter, there will be description on a method of correcting errors in a semiconductor memory device with reference to FIGS. 3 through 19.

Referring to FIGS. 3 through 19, in a write operation on the semiconductor memory device 200a, the ECC circuit 350 generates the q-bit parity data PRT based on the $2^p$-bit main data MD from the memory controller 100, and writes the codeword CW including the main data MD and the parity data PRT in the memory cell array 300, where q is greater than p and p and q are natural numbers equal to or greater than two. In a read operation on the semiconductor memory device 200, the I/O gating circuit 290 reads the codeword CW including the $2^p$-bit main data MD and the q-bit parity data PRT from a selected memory cell row of the memory cell array 300 (S110).

The ECC circuit 350 generates q-bit syndromes SDR based on the read codeword CW (S120.) The q-bit syndromes may be generated based on q-bit check bits CHB and the q-bit parity data PRT and the q-bit check bits CHB may be generated based on the $2^p$-bits main data MD. The decoder 370 may correct errors in the read codeword CW on a per symbol basis, based on the syndromes SDR, where a first data of a first memory cell of the selected memory cell row and a second data of a second memory cell of the selected memory cell row are assigned one symbol (S130). The first memory cell and the second memory cell may be adjacent to each other. Values of the q-bit syndromes SDR may be linearly independent in first through third cases. The first case corresponds to a case when the first data has an error and the second data has no error, the second case corresponds to a case when the first data has no error and the second data has an error and the third case corresponds to a case when the first data has an error and the second data has an error respectively.

Therefore, according to example embodiments, errors are corrected in a codeword read from the selected memory cell row, two data of two adjacent memory cells are assigned to one symbol and one or two errors in the two adjacent memory cells having high probability of having errors are corrected by unit of the symbol. Therefore, a number of parity bits or check bits required for correcting errors may be reduced.

Figure 20:
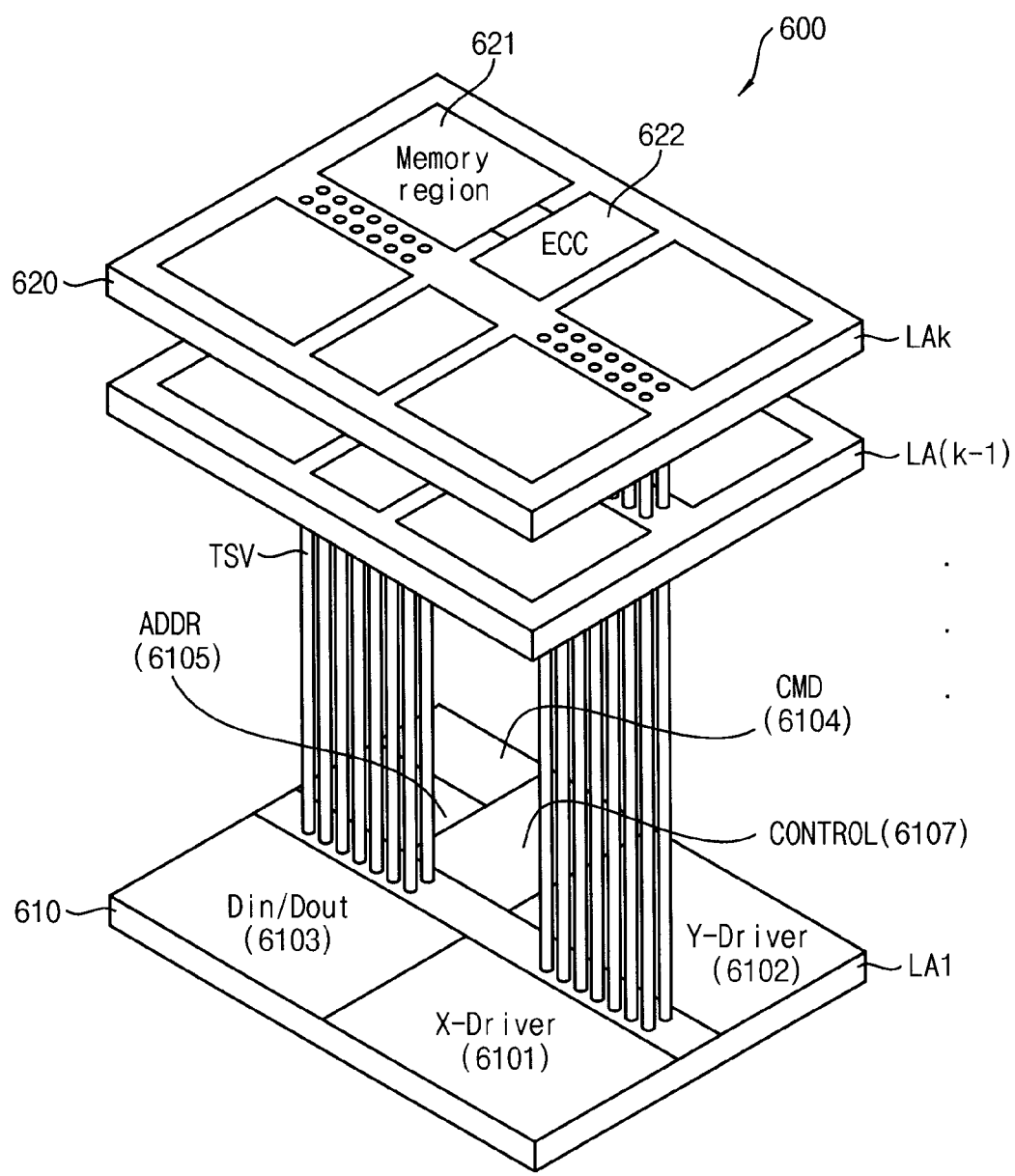
FIG. 20 is a structural diagram illustrating a semiconductor memory device according to at least one example embodiment.

FIG. 20 is a structural diagram illustrating a semiconductor memory device according to at least one example embodiment.

Referring to FIG. 20, a semiconductor memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LA may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include resistive type memory cells or dynamic memory cells as described with reference to 4A through 5.

The first semiconductor integrated circuit layer 610 may further include a control logic 6107. The control logic 6107 may control an access to the memory region 621 based on a command and an address signal from a memory controller and may generate control signals for accessing the memory region 621.

The kth semiconductor integrated circuit layer 620 may include the memory region 621 including a memory call array and an ECC circuit 622. The ECC circuit 622 may perform ECC encoding and ECC decoding on data in the memory region 621. The ECC circuit 622 may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors.

Figure 21:
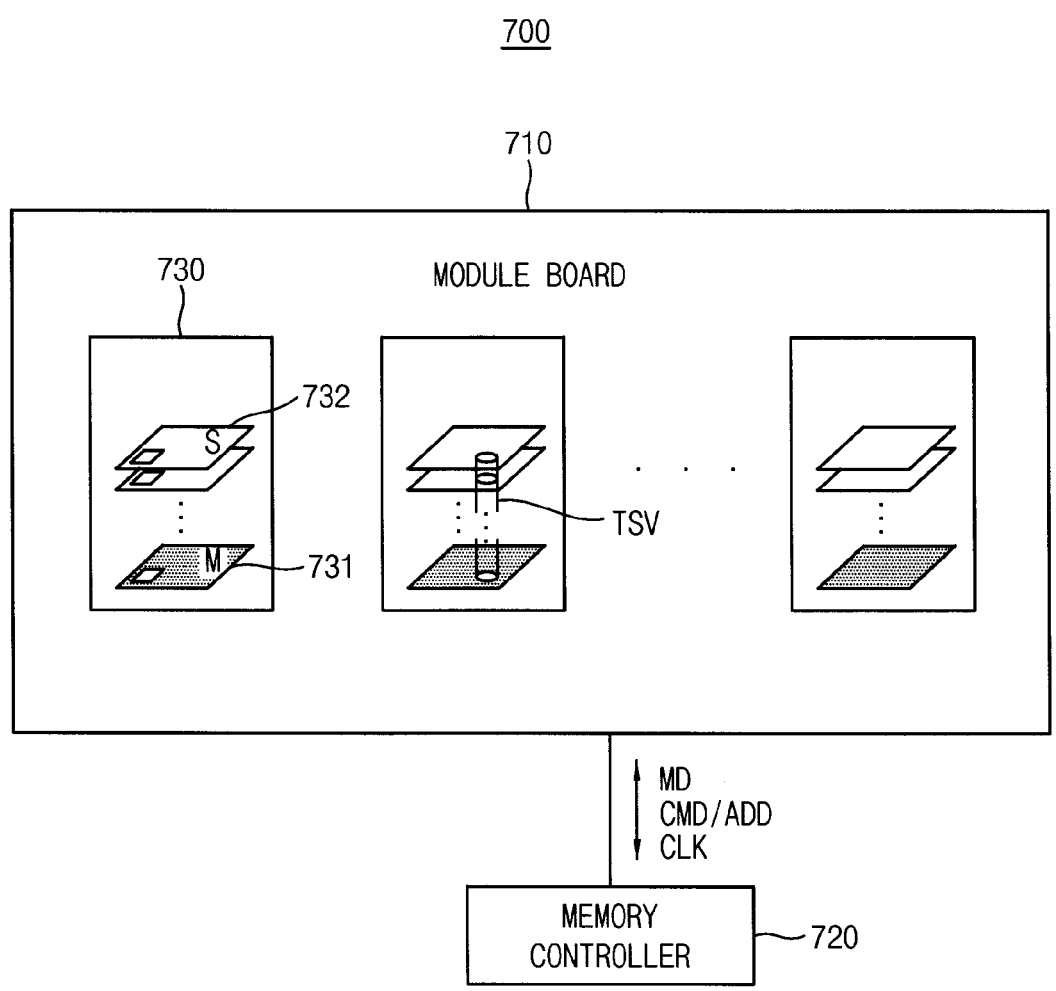
FIG. 21 illustrates a memory system including the semiconductor memory device according to at least one example embodiment.

FIG. 21 illustrates a memory system including the semiconductor memory device according to at least one example embodiment.

Referring to FIG. 21, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a MRAM chip or a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include a memory cell array having resistive type memory cells or dynamic memory cells and an ECC circuit that performs ECC encoding and ECC decoding on data in the memory cell array. The ECC circuit may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors.

In addition, in at least one example embodiment, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 22:
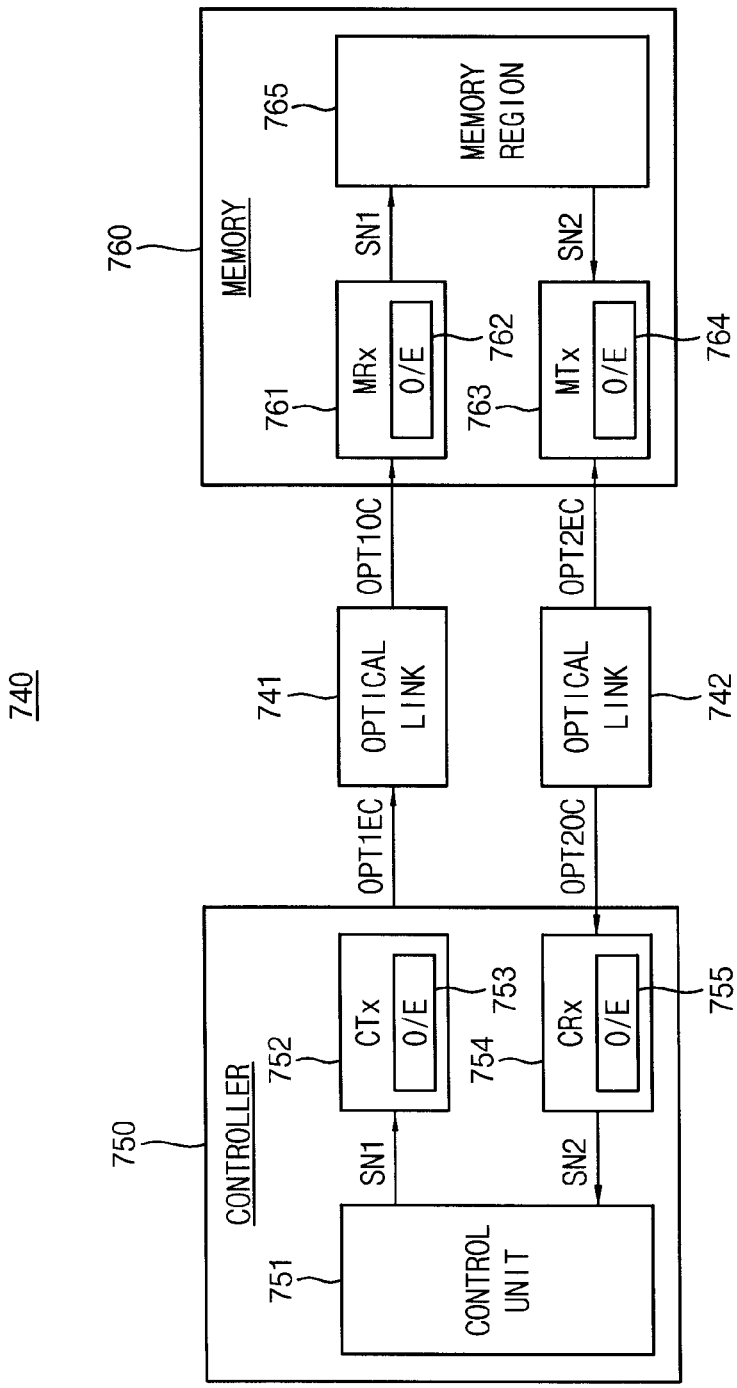
FIG. 22 is a block diagram illustrating a memory system including the semiconductor memory device according to at least one example embodiment.

FIG. 22 is a block diagram illustrating a memory system including the semiconductor memory device according to at least one example embodiment.

Referring to FIG. 22, a memory system 740 may include optical links 741 and 742, a controller 750, and a semiconductor memory device 760. The optical links 741 and 742 interconnect the controller 750 and the semiconductor memory device 760. The controller 750 may include a control unit 751, a first transmitter 752, and a first receiver 754. The control unit 751 may transmit a first electrical signal SN1 to the first transmitter 752. The first electrical signal SN1 may include command signals, clock signals, address signals, or write data transmitted to the semiconductor memory device 760.

The first transmitter 752 may include a first optical modulator 753, and the first optical modulator 753 may convert the first electrical signal SN1 into a first optical transmission signal OTP1EC and may transmit the first optical transmission signal OTP1EC to the optical link 741. The first optical transmission signal OTP1EC may be transmitted by serial communication through the optical link 741. The first receiver 754 may include a first optical demodulator 755, and the first optical demodulator 755 may convert a second optical reception signal OPT2OC received from the optical link 742 into a second electrical signal SN2 and may transmit the second electrical signal SN2 to the control unit 750.

The semiconductor memory device 760 may include a second receiver 761, a memory region 765 having resistive type memory cells or dynamic memory cells, and a second transmitter 764. The second receiver 761 may include a second optical demodulator 762, and the second optical demodulator 762 may convert the first optical reception signal OPT1OC received from the optical link 741 into the first electrical signal SN1 and may transmit the first optical reception signal OPT1OC to the memory region 765.

In the memory region 765, write data is written to the memory cells in response to the first electrical signal SN1, or data read from the memory region 765 is transmitted as a second electrical signal SN2 to the second transmitter 764. In addition, the memory region 765 may include an ECC circuit that performs ECC encoding and ECC decoding on data in the memory cells. The ECC circuit may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors. The second electrical signal SN2 may include clock signals and read data transmitted to the memory controller 750. The second transmitter 763 may include a second optical modulator 764, and the second optical modulator 764 may convert the second electrical signal SN2 into the second optical data signal OPT2EC and transmits the second optical data signal OPT2EC to the optical link 742. The second optical transmission signal OTP2EC may be transmitted by serial communication through the optical link 742.

Figure 23:
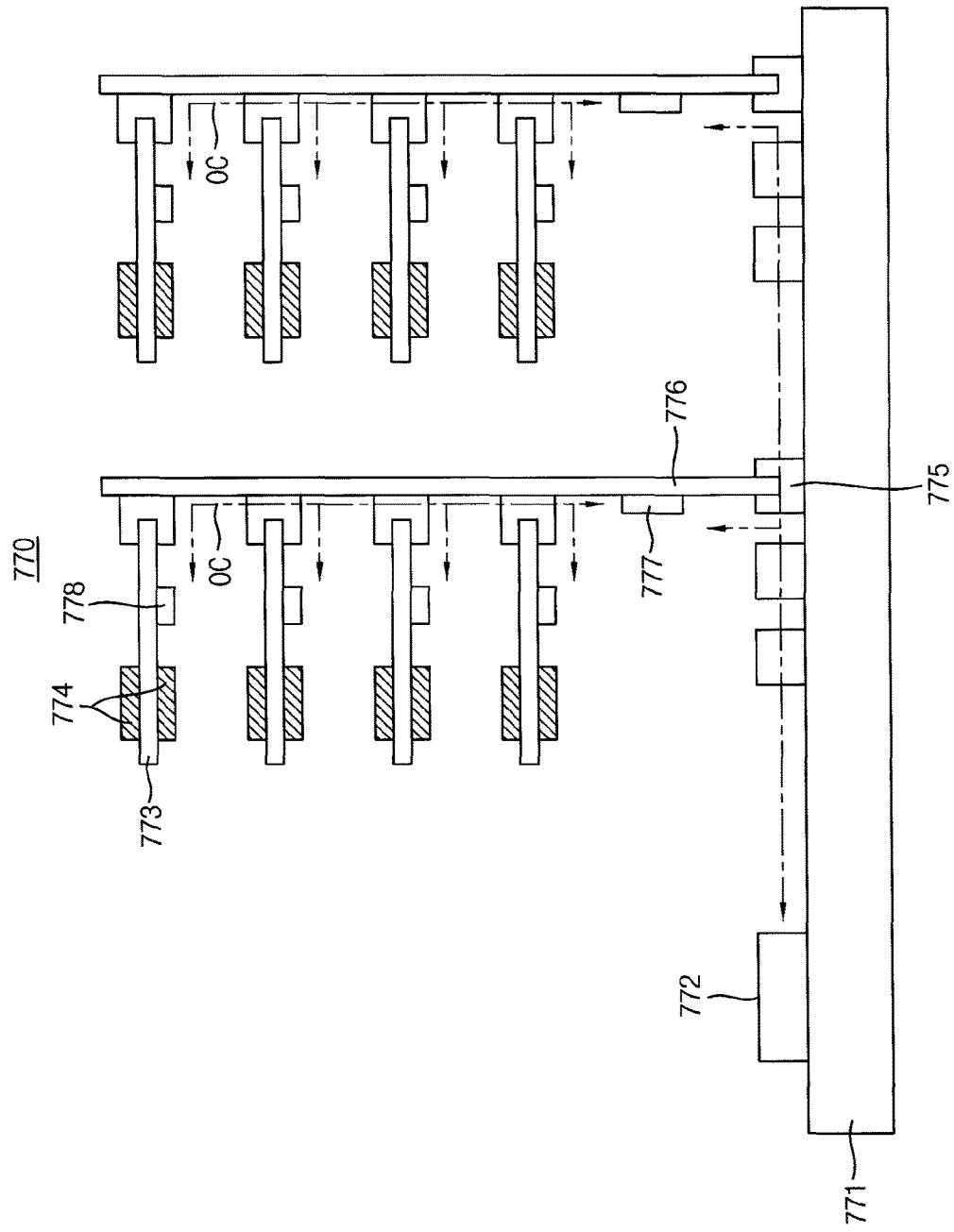
FIG. 23 is a block diagram illustrating a server system including the semiconductor memory device according to at least one example embodiment.

FIG. 23 is a block diagram illustrating a server system including the semiconductor memory device according to at least one example embodiment.

Referring to FIG. 23, a server system 770 includes a memory controller 772 and a plurality of memory modules 773. Each of the memory modules 773 may include a plurality of semiconductor memory devices 774. The semiconductor memory devices 774 may include a memory cell array having resistive type memory cells or dynamic memory cells and an ECC circuit that performs ECC encoding and ECC decoding on data in the memory cell array. The ECC circuit may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors.

In the server system 770, a second circuit board 776 is coupled to each of sockets 775 of a first circuit board 771. The server system 770 may be designed to have a channel structure in which one second circuit board 776 is connected to the first circuit board 771 according to signal channels.

Meanwhile, a signal of the memory modules 773 may be transmitted via an optical IO connection. For the optical IO connection, the server system 770 may further include an electric-to-optical conversion unit 777, and each of memory modules 773 may further include an optical-to-electrical conversion unit 778.

The memory controller 772 is connected to the electric-to-optical conversion unit 777 through an electrical channel EC. The electric-to-optical conversion unit 777 converts an electrical signal received from the memory controller 772 through the electrical channel EC into an optical signal and transmits the optical signal to an optical channel OC. Also, the electric-to-optical conversion unit 777 converts an optical signal received through the optical channel OC into an electrical signal and transmits the electrical signal to the electrical channel EC.

The memory module 773 is connected to the electric-to-optical conversion unit 777 through the optical channel OC. An optical signal applied to the memory module 773 may be converted into an electrical signal through the optical-to-electric conversion unit 778 and may be transmitted to the semiconductor memory chips 774. The server system 770 including the optical connection memory modules may support high storage capacity and a high processing speed.

Figure 24:
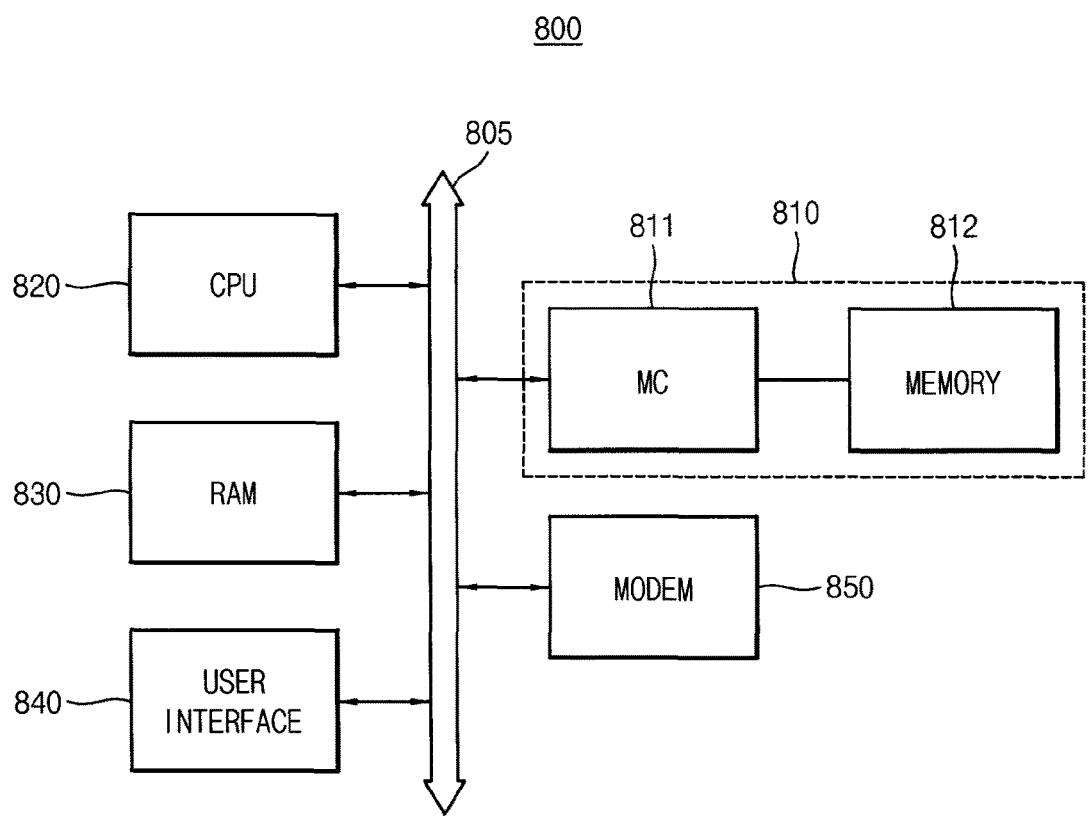
FIG. 24 is a block diagram illustrating a computing system including the semiconductor memory device according to at least one example embodiment.

FIG. 24 is a block diagram illustrating a computing system including the semiconductor memory device according to at least one example embodiment.

Referring to FIG. 27, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the semiconductor memory system 810.

The memory system 810 may include a semiconductor memory device 812 and a memory controller 811. Data processed by the CPU 820 or external data is stored in the semiconductor memory device 812. The semiconductor memory device 812 may include a memory cell array having resistive type memory cells or dynamic memory cells and an ECC circuit that performs ECC encoding and ECC decoding on data in the memory cell array. The ECC circuit may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Figure 25:
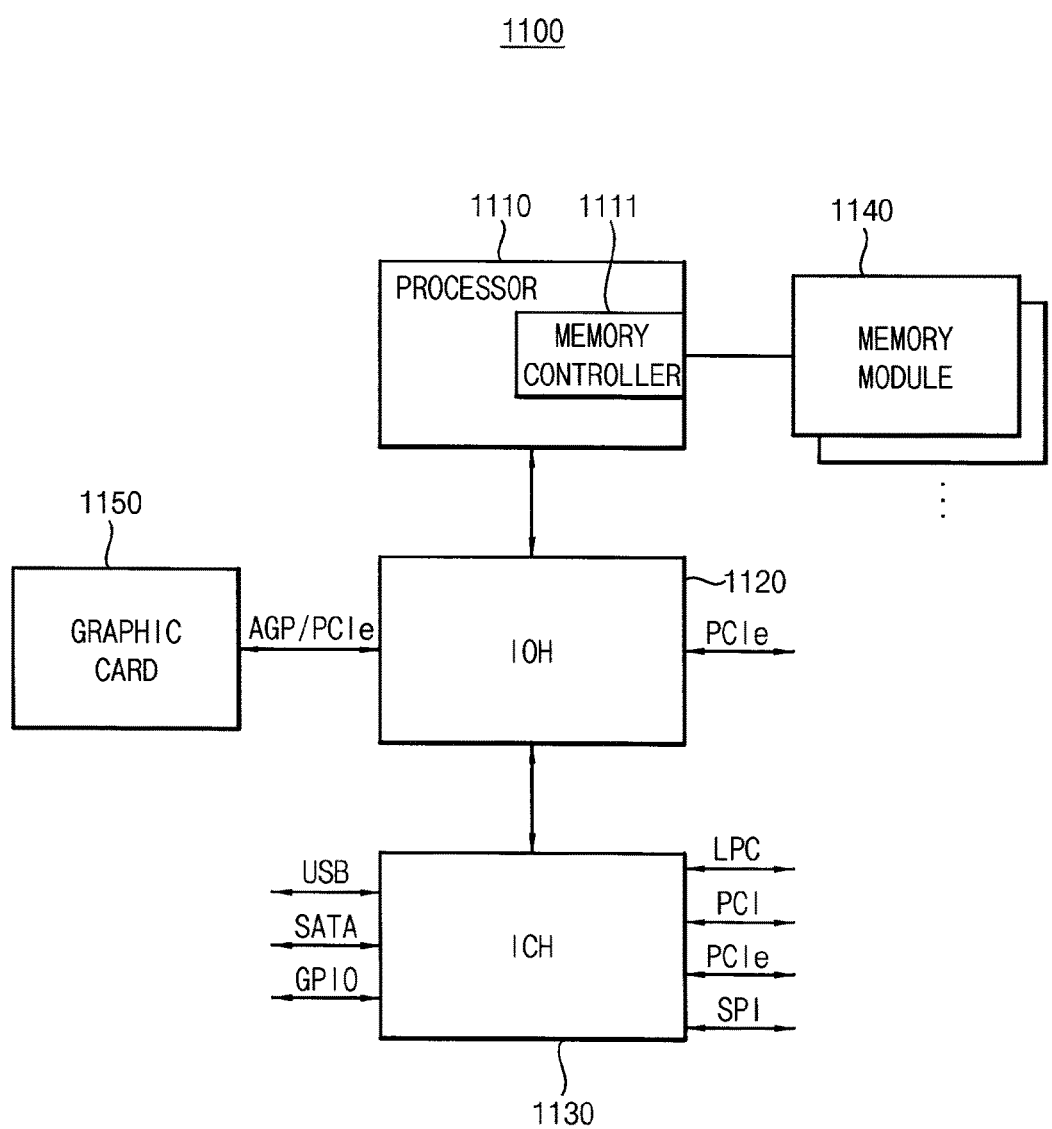
FIG. 25 is a block diagram illustrating a computing system including the semiconductor memory device according to at least one example embodiment.

FIG. 25 is a block diagram illustrating a computing system including the semiconductor memory device according to at least one example embodiment.

Referring to FIG. 25, a computing system 1100 may include a processor 1110, an input/output hub (IOH) 1120, an input/output controller hub (ICH) 1130, at least one memory module 1140 and a graphics card 1150. In some example embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some example embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some example embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some example embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may include a memory cell array having resistive type memory cells or dynamic memory cells and an ECC circuit that performs ECC encoding and ECC decoding on data in the memory cell array. The ECC circuit may correct errors in a codeword read from the selected memory cell row on a per symbol basis, where two data of two adjacent memory cells are assigned to one symbol as described with reference to FIGS. 10 through 18. Therefore, a number of parity bits or check bits required for correcting errors may be reduced by correcting one or two errors in the two adjacent memory cells having high probability of having errors.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some example embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some example embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 1110, the input/output hub 1120 and the input/output controller hub 1130 may be implemented as separate chipsets or separate integrated circuits. In other example embodiments, at least two of the processor 1110, the input/output hub 1120 and the input/output controller hub 1130 may be implemented as a single chipset.

The present disclosure may be applied to systems using semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a memory cell array in which a plurality of memory cells are arranged; and
   an error correcting code (ECC) circuit configured to,
      generate parity data based on main data,
      write a codeword including the main data and the parity data in the memory cell array,
      read the codeword from a selected memory cell row to generate syndromes, and
      correct errors using the parity data in the read codeword on a per symbol basis based on the syndromes, the main data including first data of a first memory cell of the selected memory cell row and second data of a second memory cell of the selected memory cell row, the first data and the second data being assigned to one symbol of a plurality of symbols, the first memory cell and the second memory cell being adjacent to each other in the memory cell array.

2. The semiconductor memory device of claim 1,
   wherein the main data includes $2^p$ bits and the parity data includes q bits, where q is greater than p and p and q are natural numbers equal to or greater than two, and
   wherein the ECC circuit is configured to generate q-bit check bits based on data in the read codeword, and generate the syndromes with q-bits based on the q-bit check bits and q-bit parity data in the read codeword.

3. The semiconductor memory device of claim 2, wherein the ECC circuit is configured to correct the errors if the one symbol includes errors equal to or smaller than two.

4. The semiconductor memory device of claim 2,
   wherein values of the q-bit syndromes are linearly independent in first through third cases, and
   wherein the first case corresponds to a case when the first data has an error and the second data has no error, the second case corresponds to a case when the first data has no error and the second data has an error, and the third case corresponds to a case when the first data has an error and the second data has an error.

5. The semiconductor memory device of claim 2, wherein the ECC circuit comprises:
   an encoder configured to generate the parity data based on the main data; and
   a decoder configured to generate the syndromes based on the read codeword to correct the errors.

6. The semiconductor memory device of claim 5, wherein the encoder comprises a plurality of parity generators, each of the plurality of parity generators being configured to generate a corresponding parity bit of the q-bit parity data based on the $2^p$-bit main data.

7. The semiconductor memory device of claim 5, wherein the decoder comprises:
   a check bit generator configured to generate the q-bit check bits based on the main data of the read codeword;
   a syndrome generator configured to generate the q-bit syndromes based on the q-bit check bits and the parity data of the read codeword; and
   a corrector configured to correct the errors in the read codeword based on the q-bit syndromes.

8. The semiconductor memory device of claim 7, wherein the syndrome generator is configured to generate the syndromes such that each syndrome has a logic level according to whether corresponding bits of the q-bit check bits and the q-bit parity data are equal to each other.

9. The semiconductor memory device of claim 8, wherein the syndrome generator includes a plurality of logic elements, each of the plurality of logic elements being configured to perform an XOR operation on corresponding bits of the q-bit check bits and the q-bit parity data to generate a corresponding syndrome.

10. The semiconductor memory device of claim 7, wherein the corrector includes a plurality of unit correctors, and each of the plurality of unit correctors are configured to correct errors in each of the plurality of symbols on the per symbol basis if a number of the errors is equal to or smaller than two based on the syndromes.

11. The semiconductor memory device of claim 10, wherein each of the unit correctors includes:
    a symbol decoder configured to determine whether at least one of the first data and the second data has an error based on the syndromes to generate first through third output signals; and
    a data corrector configured to correct errors in one of the plurality of symbols based on the first through third output signals.

12. The semiconductor memory device of claim 11, wherein the symbol decoder includes:
    a first sub decoder configured to provide the first output signal indicating whether the first data has an error based on the syndromes;
    a second sub decoder configured to provide the second output signal indicating whether the second data has an error based on the syndromes; and
    a third sub decoder configured to provide the third output signal indicating whether each of the first data and second data has an error based on the syndromes.

13. The semiconductor memory device of claim 11, wherein the data corrector includes:
    a first logic element configured to perform an OR operation on the first output signal and the second output signal;
    a second logic element configured to perform an OR operation on the second output signal and the third output signal;
    a third logic element configured to perform an XOR operation on the first data and an output of the first logic element to output a first corrected data; and
    a fourth logic element configured to perform an XOR operation on the second data and an output of the second logic element to output a second corrected data.

14. The semiconductor memory device of claim 11, wherein the data corrector is configured to invert the first data if the first data has an error, invert the second data if the second data has an error, and invert the first data and the second data if each of the first data and the second data has an error.

15. The semiconductor memory device of claim 1,
    wherein each of the plurality of memory cells is a resistive type memory cell, and
    wherein the memory cell array includes a three-dimensional memory array in which at least one of word-lines and bit-lines are shared between levels.

16. The semiconductor memory device of claim 1, wherein first data of the first memory cell of the selected memory cell row and second data of the second memory cell of the selected memory cell row are assigned to a same symbol of the plurality of symbols.

17. The semiconductor memory device of claim 16, wherein the first memory cell and the second memory cell are on a same word-line.

18. A device, comprising:
    a decoder configured to,
       receive a codeword from a selected memory cell row of a memory cell array, the received codeword including main data and parity data, the main data including first data of a first memory cell of the selected memory cell row and second data of a second memory cell of the selected memory cell row, the first memory cell and the second memory cell being adjacent to each other in the memory cell array, the first data and the second data being assigned to a first symbol of a plurality of symbols, generate an error indicator for the first symbol based on the received codeword, detect errors in the received codeword based on the error indicator, and correct the detected errors in the received codeword using the parity data.

19. The device of claim 18, wherein the decoder is configured to generate the error indicator based on the parity data and check bit data derived from the main data.

20. The device of claim 18, wherein the decoder is configured to generate the error indicator for the first symbol by, generating a first sub-error indicator for the first data, generating a second sub-error indicator for the second data, and combining the first sub-error indicator and the second error indicator.

21. The device of claim 20, wherein the decoder is configured to detect errors in the first and second data based on the first error indicator, the second error indicator, and the third error indicator.

22. The device of 20, wherein the combining includes performing an XOR operation on bits of the first error indicator and bits of the second error indicator.

\* \* \* \* \*